(12) United States Patent
Barth et al.

(10) Patent No.: US 6,426,904 B2
(45) Date of Patent: Jul. 30, 2002

(54) STRUCTURES FOR WAFER LEVEL TEST AND BURN-IN

(75) Inventors: John E. Barth, Williston; Claude L. Bertin, South Burlington; Jeffrey H. Dreibelbis, Williston; Wayne F. Ellis, Jericho; Wayne J. Howell, Williston; Erik L. Hedberg, Essex Junction; Howard L. Kalter, Colchester; William R. Tonti, Essex Junction; Donald L. Wheater, Hinesburg, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/803,500

(22) Filed: Mar. 9, 2001

Related U.S. Application Data

(62) Division of application No. 09/191,954, filed on Nov. 13, 1998, now Pat. No. 6,233,184.

(51) Int. Cl.$^7$ ............................................. G11C 29/00
(52) U.S. Cl. ............................................. 365/201
(58) Field of Search ................. 365/201, 200; 324/254, 263, 265

(56) References Cited

U.S. PATENT DOCUMENTS

| 4,055,754 A | 10/1977 | Chesley | 235/302.3 |
|---|---|---|---|
| 4,092,733 A | 5/1978 | Coontz et al. | 365/200 |
| 4,191,996 A | 3/1980 | Chesley | 324/738 E |
| 4,872,168 A | 10/1989 | Aadsen et al. | 371/21.3 |
| 4,896,055 A | 1/1990 | Fujii et al. | 324/731 |
| 4,899,208 A | 2/1990 | Dietsch et al. | 357/74 |
| 4,956,602 A | 9/1990 | Parrish | 324/158 R |
| 4,961,053 A | * 10/1990 | Krug | 324/158 R |
| 5,173,906 A | 12/1992 | Dreibelbis et al. | 371/22.5 |
| 5,241,266 A | 8/1993 | Ahmad et al. | 324/158 |
| 5,294,776 A | 3/1994 | Furuyama | 324/158 |
| 5,307,010 A | 4/1994 | Chiu | 324/158 R |
| 5,313,424 A | 5/1994 | Adams et al. | 365/200 |

(List continued on next page.)

FOREIGN PATENT DOCUMENTS

| WO | WO 97/436— A2 | 11/1997 |
|---|---|---|

*Primary Examiner*—Tan T. Nguyen
(74) *Attorney, Agent, or Firm*—Robert A. Walsh

(57) ABSTRACT

Wafer test and burn-in is accomplished with state machine or programmable test engines located on the wafer being tested. Each test engine requires less than 10 connections and each test engine can be connected to a plurality of chips, such as a row or a column of chips on the wafer. Thus, the number of pads of the wafer that must be connected for test is substantially reduced while a large degree of parallel testing is still provided. The test engines also permit on-wafer allocation of redundancy in parallel so that failing chips can be repaired after burn-in is complete. In addition, the programmable test engines can have their code altered so test programs can be modified to account for new information after the wafer has been fabricated. The test engines are used during burn-in to provide high frequency write signals to DRAM arrays that provide a higher effective voltage to the arrays, lowering the time required for burn-in. Connections to the wafer and between test engines and chips are provided along a membrane attached to the wafer. Membrane connectors can be formed or opened after the membrane is connected to the wafer so shorted chips can be disconnected. Preferably the membrane remains on the wafer after test, burn-in and dicing to provide a chip scale package. Thus, the very high cost of TCE matched materials, such as glass ceramic contactors, for wafer burn-in is avoided while providing benefit beyond test and burn-in for packaging.

30 Claims, 28 Drawing Sheets

U.S. PATENT DOCUMENTS

| | | | |
|---|---|---|---|
| 5,315,130 A | 5/1994 | Hively et al. | 257/48 |
| 5,323,035 A | 6/1994 | Leedy | 257/248 |
| 5,366,906 A | 11/1994 | Wojnarowski et al. | 437/8 |
| 5,444,366 A | 8/1995 | Chiu | 324/158.1 |
| 5,453,404 A | 9/1995 | Leedy | 437/203 |
| 5,483,175 A | 1/1996 | Ahmad et al. | 324/766 |
| 5,532,614 A | 7/1996 | Chio | 324/763 |
| 5,570,032 A | 10/1996 | Atkins et al. | 324/765 |
| 5,590,079 A | 12/1996 | Lee et al. | 365/201 |
| 5,600,257 A * | 2/1997 | Leas et al. | 324/754 |
| 5,623,214 A | 4/1997 | Pasiecznik, Jr. | 324/754 |
| 5,642,054 A | 6/1997 | Pasiecznik, Jr. | 324/754 |
| 5,648,661 A | 7/1997 | Rostoker et al. | 257/48 |
| 5,696,404 A | 12/1997 | Murari et al. | 257/620 |

* cited by examiner

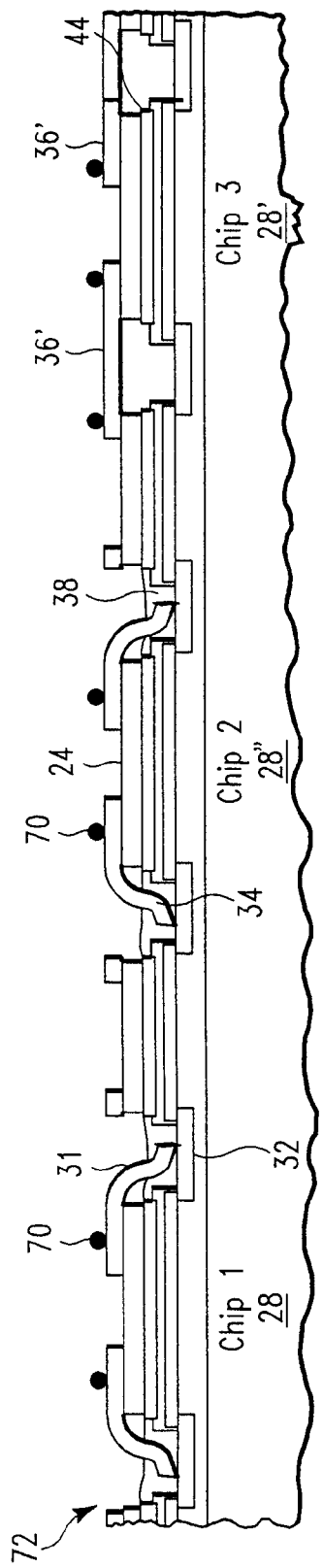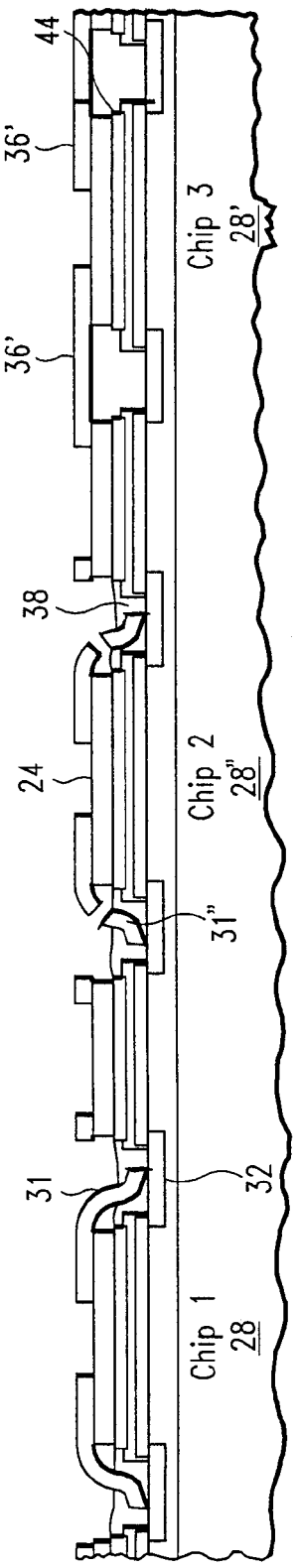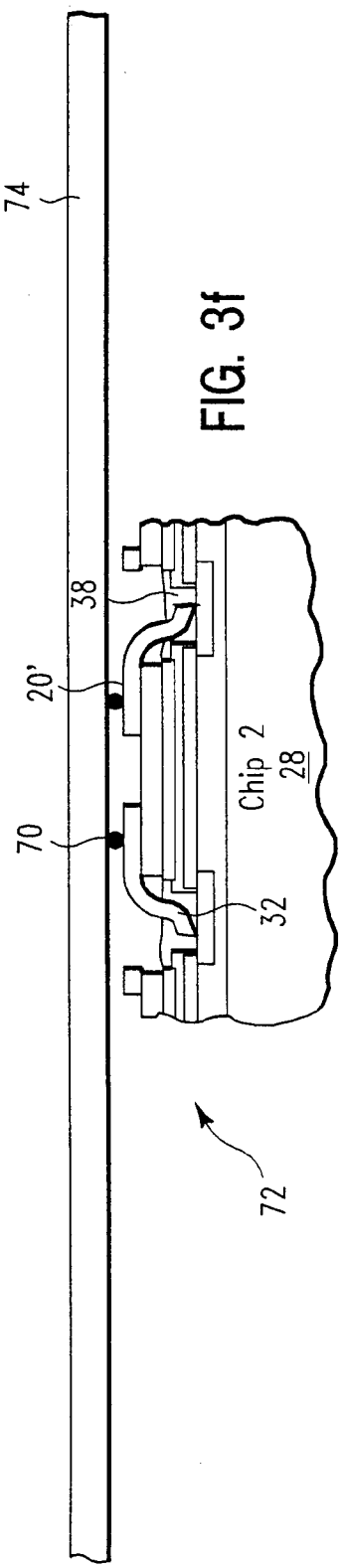

Each Data line unique to BIST

STRUCTURES FOR WAFER LEVEL TEST AND BURN-IN

This application is a division of application Ser. No. 09/191,954, filed Nov. 13, 1998, which is now U.S. Pat. No. 6,233,184.

FIELD OF THE INVENTION

This invention generally relates to burn-in. More particularly, it relates to test circuits on a wafer that permit reduced pin-count testing and burning-in of chips on the wafer. It also relates to a structure that provides for connecting good chips and disconnecting shorted chips.

BACKGROUND OF THE INVENTION

Testing a large number of integrated circuit chips in parallel at the wafer level provides significant advantage since test time and cost are substantially reduced. At present, large scale testers including mainframe computers are needed to test even one chip at a time, and the complexity of these machines is increased when the capability of testing arrays of chips in parallel is added. Nevertheless, because of the time savings parallel testing provides, high pin-count testers capable of probing and collecting data from many chips simultaneously have been introduced, and the number of chips that can be tested simultaneously has been gradually increasing.

Wafer level burn-in adds to the difficulty and cost of simultaneous testing since the high pin-count probes must be kept in place on each wafer for many hours and the probes must maintain contact as temperature changes from room temperature to about 140° C. In addition, a scheme to disconnect or limit current to shorted chips is needed to maintain voltage uniformity across the wafer.

Commonly assigned U.S. Pat. No. 5,600,257, to Leas et al. teaches apparatus for simultaneously testing or burning in all the integrated circuit chips on a product wafer. The apparatus comprises a glass ceramic carrier having test chips. Glass ceramic has a thermal coefficient of expansion comparable to that of silicon, enabling probe contact as temperature varies. The test chips provide test patterns. Voltage regulators are on the test chips to provide a specified voltage to the product chips and to limit current to shorted chips. However, glass ceramic carriers large enough to accommodate 8 inch semiconductor wafers are very expensive.

"Known good die," chips that have been individually tested and burned-in after dicing from a wafer, are becoming increasingly available in the industry to provide for multichip modules and other applications where high reliability is needed. Burning-in individual chips after dicing avoids the difficulties of contacting and burning-in all chips on a wafer at once. However, there is a substantial cost to handling, aligning, and holding individual chips for burn-in stress over many hours as compared with testing and burning-in at the wafer level.

Substantial lower cost would result from an improved wafer burn-in scheme that permits parallel test and burn-in of the chips on a wafer before dicing without a costly glass ceramic interface, and this solution is provided by the following invention.

SUMMARY OF THE INVENTION

It is therefore an object of the present invention to provide a wafer having integrated circuit chips and at least one test engine.

It is another object of the present invention to provide a test engine on a wafer capable of providing test signals to a plurality of chips.

It is another object of the present invention to provide a test engine on a wafer capable of providing test signals for full functional testing.

It is another object of the present invention to provide a test engine on a wafer capable of providing test signals at high frequency for testing and burn-in.

It is another object of the present invention to provide a test engine on a wafer capable of being programmed so patterns generated by the test engine can be altered after fabrication of the test engine to characterize newly discovered defects.

It is another object of the present invention to provide circuits capable of efficiently allocating redundancy repair information so integrated circuit chips can be optimally repaired after test or after burn-in to provide a high wafer yield.

It is another object of the present invention to distribute test engine functions so that some test engine functions are central and shared among several chips on a wafer and others are specific for each chip and located on each chip on the wafer or in the adjacent kerf.

It is another object of the present invention to provide a test engine architecture that provides compare and redundancy allocation on each chip of the wafer or in an adjacent kerf while control and data are provided by a shared test engine or a plurality of shared test engines.

It is another object of the present invention to provide a flex wiring membrane on the wafer to distribute power, ground, and signals.

It is another object of the present invention that a flex wiring membrane on the wafer provides contact to test engines and chips on the wafer.

It is another object of the present invention that a flex wiring membrane on the wafer provides a chip level package.

It is another object of the present invention to reduce test and burn-in time.

It is a feature of the present invention that a flex wiring membrane on the wafer interconnects a plurality of chips with a test engine.

It is an advantage of the present invention that a large number of chips on a wafer can be tested in parallel and burned-in with a low-cost tester and a low cost prober.

It is a feature of the present invention that a flex wiring membrane on the wafer provides a way to connect good chips and disconnect shorted chips.

It is an advantage of the present invention that the high speed signals provided by on-wafer test engines allow DRAM chips to be burned-in in a time shorter than is available with conventional burn-in ovens.

These and other objects, features, and advantages of the invention are accomplished by a semiconductor structure comprising a wafer and a membrane, the wafer having integrated circuit chips. The membrane comprises wiring. The wiring comprises first contacts that electrically connect the wiring to at least one of the chips. The wiring further comprises second contacts for connecting the wiring to a next level of assembly after the chips and a corresponding portion of the membrane are diced.

Another aspect of the invention is a semiconductor structure, comprising a wafer including integrated circuit chips that have memory arrays. The wafer has a circuit comprising a first element, a second element, and a third element. The first element is capable of presenting array test patterns to the memory array. The second element is capable of receiving a result of the test patterns from the array. The third element is capable of using the result to allocate redundancy to repair a defect on the memory array. The structure includes contacts for electrically connecting the circuit for external electrical connection for testing or burning-in the array at wafer level.

Another aspect of the invention is a semiconductor structure comprising a wafer having a plurality of integrated circuit chips and a test engine, the test engine connected to the plurality of chips. Thus, the chips share a test engine.

Another aspect of the invention is a semiconductor structure comprising a wafer having a plurality of integrated circuit chips and a contactor physically connected to the chips. The contactor has selectable contacts to form or break electrical connection to selected chips while maintaining the physical connection.

BRIEF DESCRIPTION OF THE DRAWINGS

The foregoing and other objects, features, and advantages of the invention will be apparent from the following detailed description of the invention, as illustrated in the accompanying drawings, in which:

FIG. 1a' is a flow diagram of an alternate process;

FIGS. 3a–3e are cross sectional views of the steps of fabricating a chip scale package of the present invention including individually connectable contacts and individually disconnectable contacts;

FIG. 3f is a cross sectional view of a chip scale package of the present invention mounted to a printed circuit board;

FIG. 7c is a top view of a burn-in card connected to a membrane of the present invention which is mounted on and connected to a wafer, and the card is plugged into another card for oven burn-in;

DETAILED DESCRIPTION OF THE INVENTION

Figure 1A:
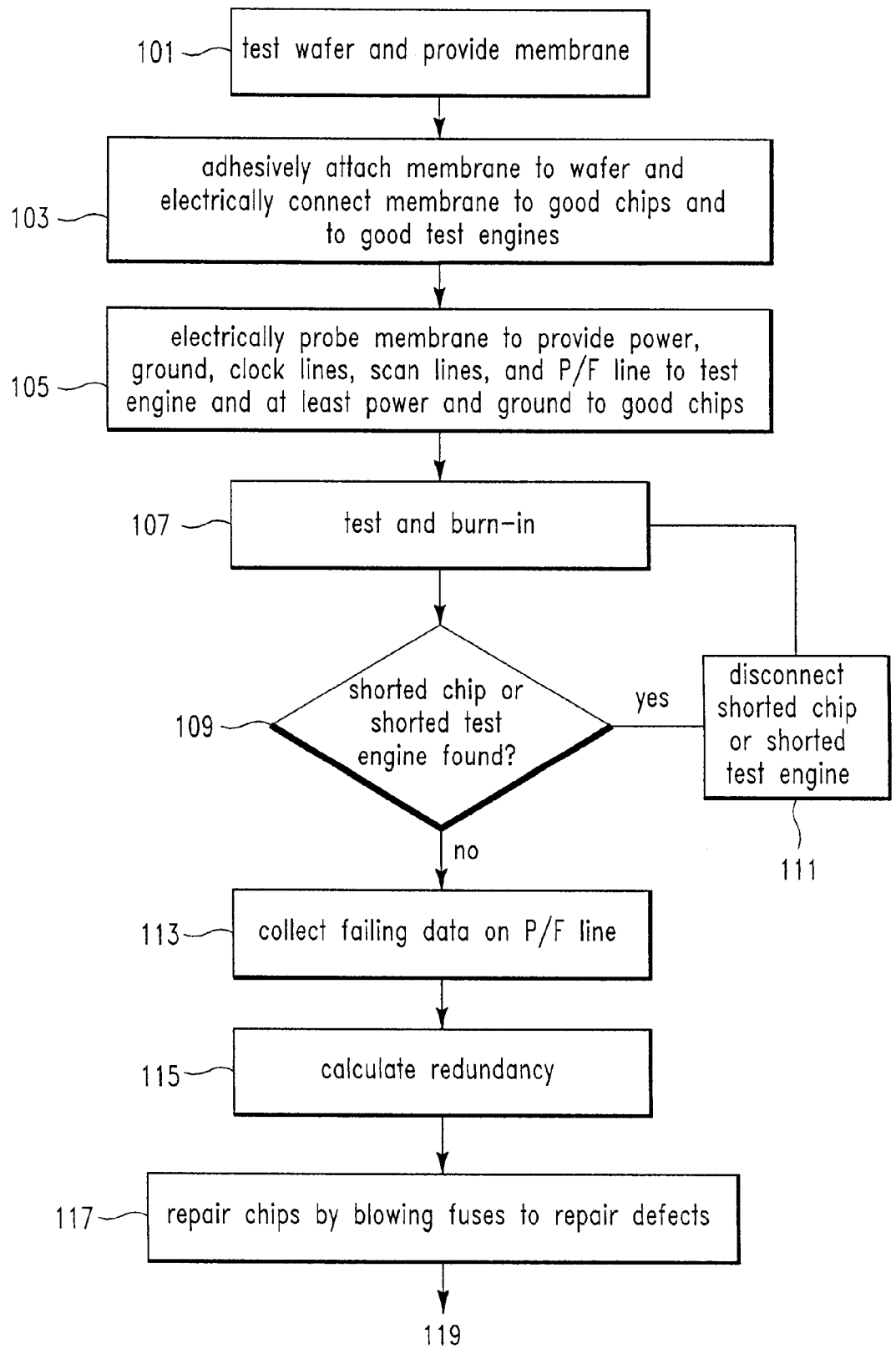
FIGS. 1a–1b is a flow diagram of the process of the invention.
Figure 1A:
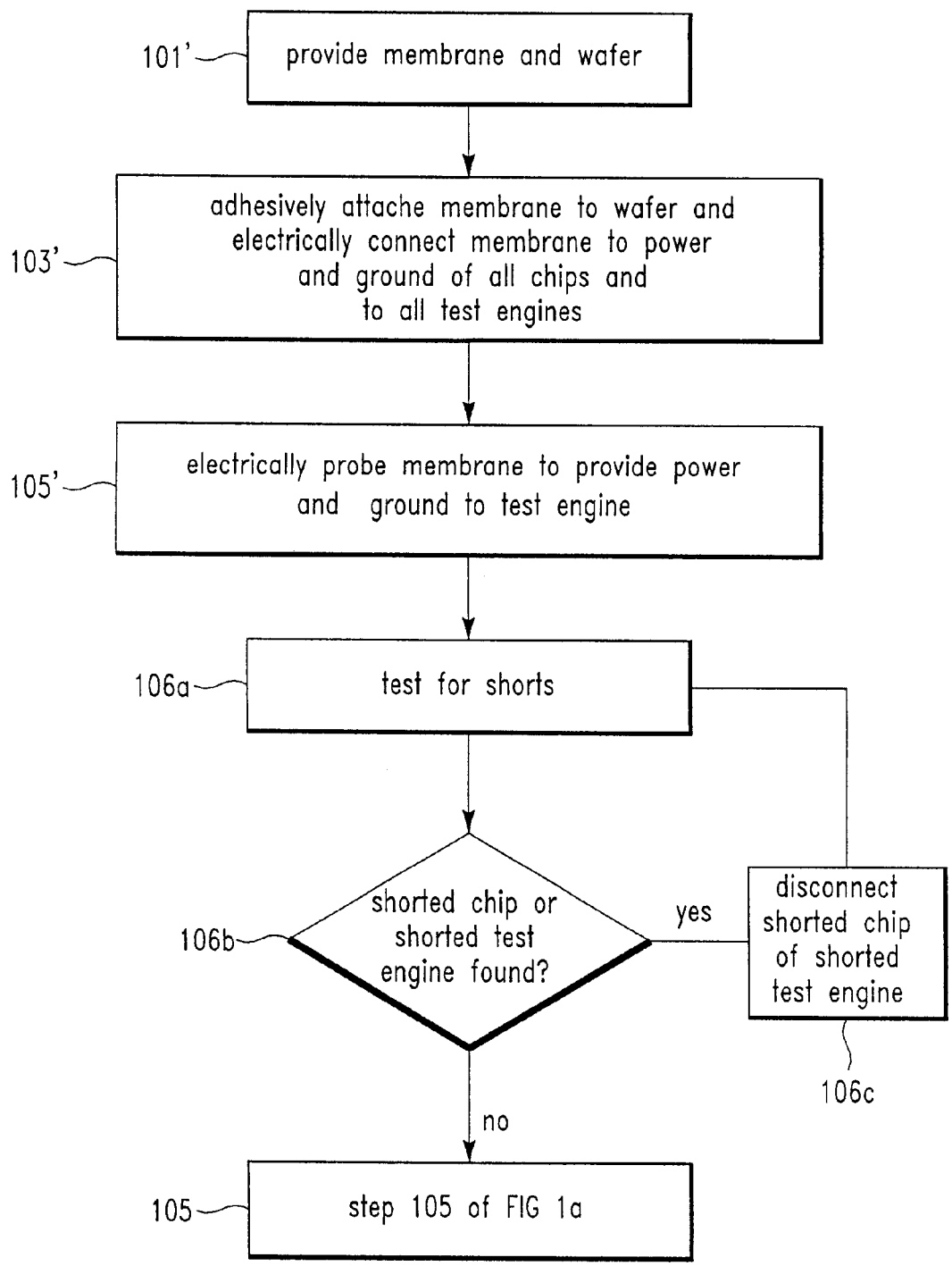

The present invention provides full wafer test and burn-in by attaching a membrane to a wafer having self test engines. It provides a low-cost scheme to provide either known good bare die or known good die in chip level packages suitable for direct attachment to printed circuit boards. The membrane has connectors that permit avoiding connection to shorted chips and that also permit disconnecting chips that short during burn-in that might interfere with the testing or burning-in of other chips on the wafer. The invention takes advantage of test engines located on the wafer, such as simple state machine test engines or processor-based test engines. In addition to providing patterns and reporting fails, the test engines provide the ability to allocate redundancy for array products such as DRAM. They also provide the ability for high speed testing since they are very closely coupled with the circuits to be tested on the wafer. The test engines can be localized on each chip of the wafer or they can be located in spaces between chips. Each chip can have its own test engine or a single test engine can be shared among several chips, such as a column or a row of chips on the wafer. Redundant test engines can be used to decrease the chance that a defective test engine prevents testing of a column of chips.

The present invention provides advantages over presently envisioned methods of testing and burning-in. First, it provides testing and burning-in with built-in self-test (BIST) type test engines, reducing the need for expensive and complex tester equipment and reducing burn-in time. Second, it provides testing at high clock speed at wafer level, something only previously available for packaged devices. It also provides burning-in at high clock speed which substantially increases the effective stress and the efficiency of burn-in, reducing the number of hours needed for burning-in devices, such as DRAM. Third, it provides a membrane contactor that simplifies contacting all the chips on a wafer. The membrane contactor eliminates the need to step across the wafer and reduces the number of wafer pads that must be contacted, reducing tester and prober cost and complexity. The membrane contactor also permits simultaneous testing of a large number of chips, if not all the chips on the wafer. The membrane contactor also maintains good contact through the entire test and burn-in cycle without risk of lost contact as temperature changes. Fourth, the membrane permits burning-in all chips on the wafer without a temperature coefficient matched probe, substantially reducing probe cost. Fifth, for array chips, such as DRAM and SRAM chips, the on-wafer test engine includes circuits capable of providing local calculation to optimize allocation of redundant cells, word lines, or bit lines to correct defects identified during the test, further reducing tester cost and complexity. Sixth, since chips are burned-in at the wafer level, this redundancy implementation can be invoked during or after burn-in, improving burn-in yield as compared to the present practice where redundancy is invoked before burn-in and any further defects generated at burn-in are not correctable. Seventh, the invention also provides testing and allocating redundancy for arrays embedded in logic chips. Eighth, an embodiment of the invention uses a programmable type of test engine circuit that permits modification of tests after the chip has been fabricated. Ninth, an embodiment of the invention permits disconnection of shorted chips while the wafer is at burn-in temperature. Finally, it permits a further increase in wafer yield because high-speed testing and burn-in are accomplished at wafer level, before dicing and packaging, and therefore the learning from these results is received earlier and can be used to more quickly fix process or design problems before too many wafers are processed.

Figure 1B:
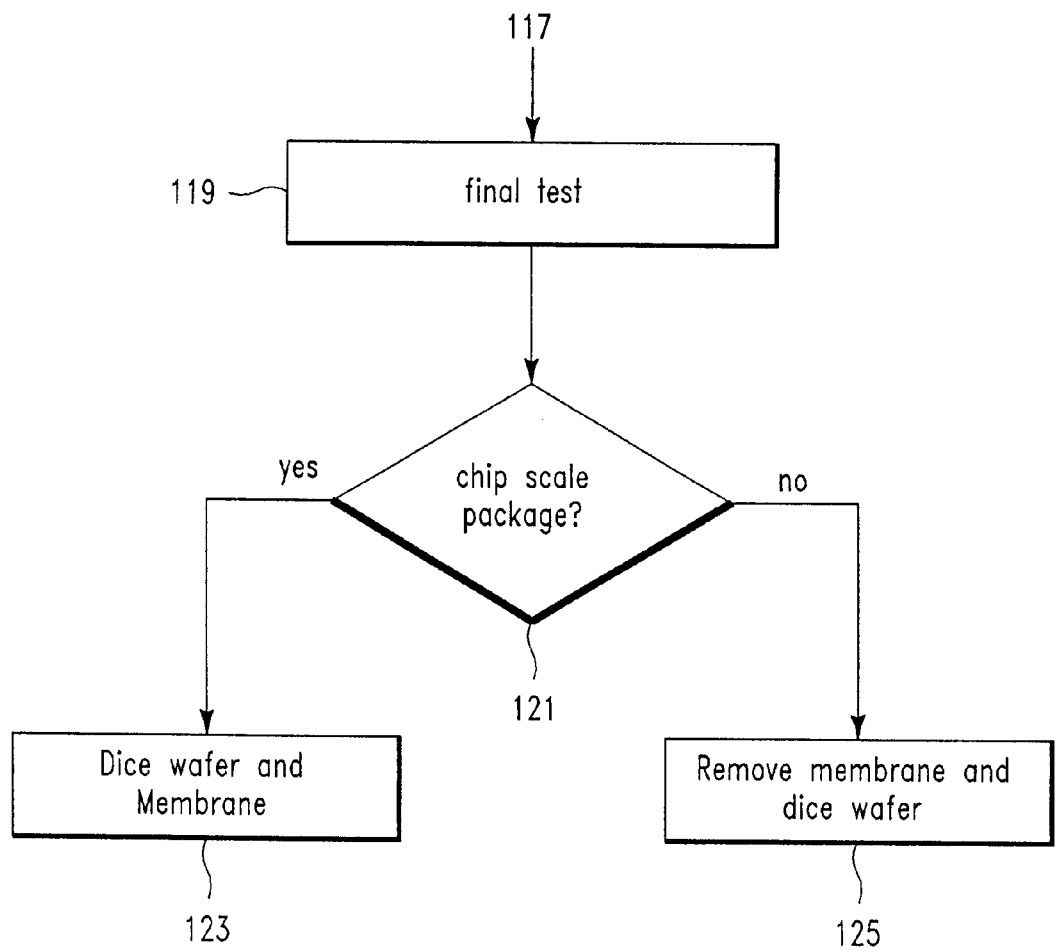
Figure 2:
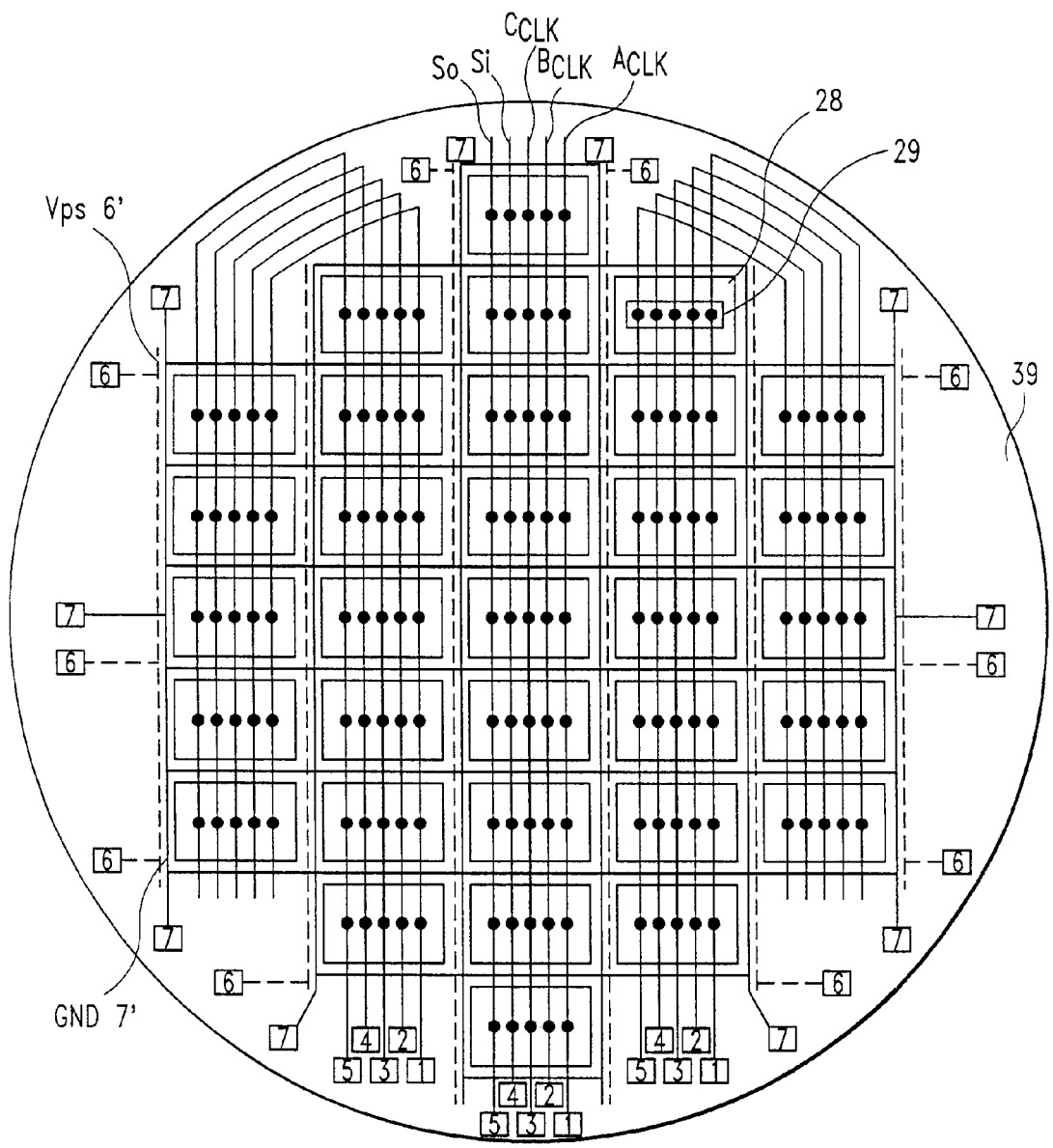
FIG. 2 is a top view of a membrane of the present invention showing wiring in the membrane and contacts to the membrane.
Figure 3A:
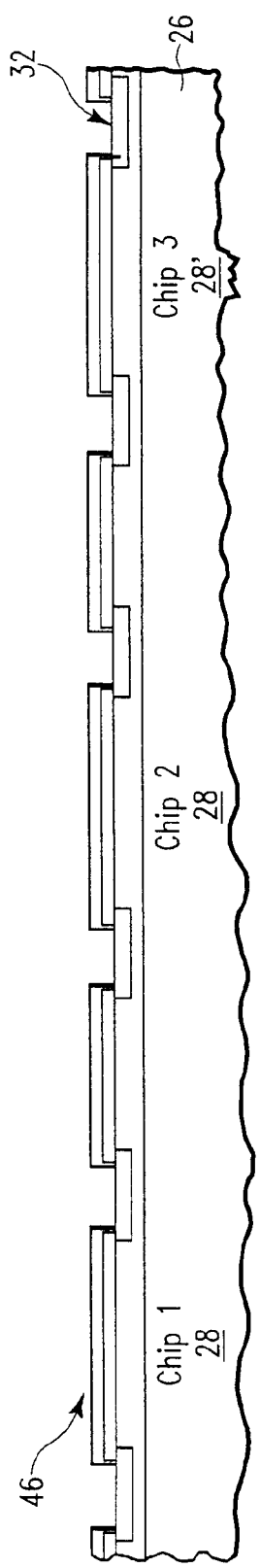
Figure 3B:
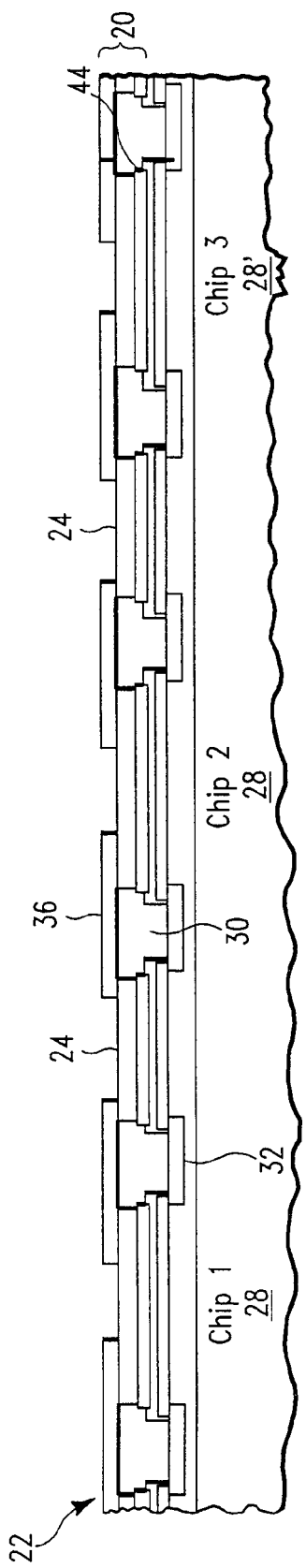
Figure 3C:
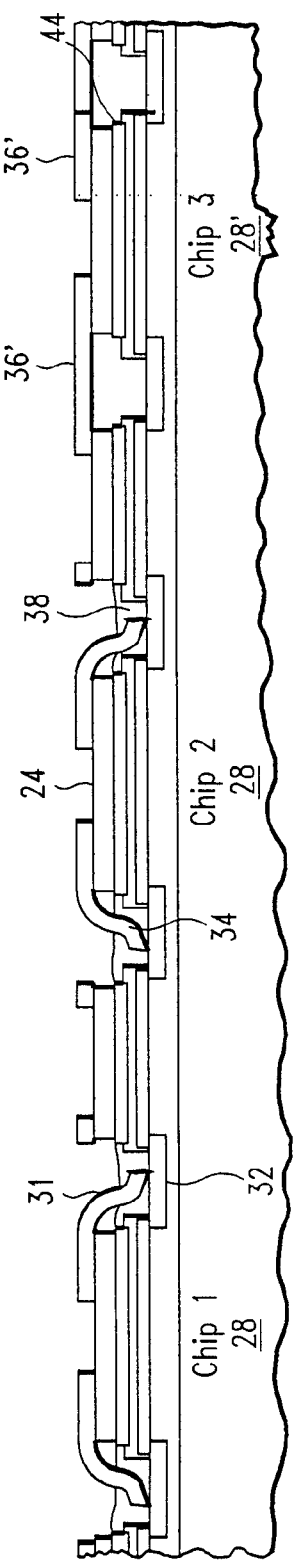

Membrane 20 having at least one wiring level 22 extending on insulation layer 24 is electrically connected and mechanically bonded to wafer 26 (FIG. 3a) after initial wafer testing, as illustrated in steps 101 and 103 of the process flow diagram of FIGS. 1a–1b, in the top view of FIG. 2, and in the cross sectional views of FIGS. 3a–3c. Wafer 26 includes integrated circuit chips 28 and test engines 29 associated with each chip 28. Integrated circuit chips 28 will be diced from wafer 26 when wafer processing steps are complete. Insulation layer 24 is formed of a material such as polyimide.

The initial test of step 101 on wafer 26 can be a full chip test or it can just be a screen to identify shorted chips (since more detailed testing will be performed later). Preferably, a yield map from the initial wafer test of step 101, stored in the tester, is used to connect good test engines 29 and/or good chips 28 to membrane 20 as shown in step 103 while leaving shorted chips disconnected. In the next step membrane 20 is probed to provide power, ground and scan to test engines 29, as shown in step 105. Through test engines 29 each chip is tested and burned-in as shown in step 107. If shorted chips are found (step 109) these chips are disconnected (step 111) and test or burn-in is resumed. Failing data is collected once burn-in is complete (step 113). From the fail data redundancy is calculated (step 115) and chips are repaired by laser cutting fuses to invoke redundancy (step 117). Finally, test engines 29 are used once again to provide a final test to ensure that all chips are now good, as shown in step 119. If the chips are to be used in a chip scale package (step 121) both the wafer and the membrane are diced so that corresponding portions of membrane 20 remain attached to each diced chip as shown in step 123. If not, membrane 20 is removed before dicing, as shown in step 125.

Alternatively, as a first step, membrane 20 is attached to wafer 26 and all test engines 29 and power and ground of all chips are electrically connected to membrane 20 as shown in steps 101' and 103' (FIG. 1a'). Membrane 20 is now probed and power and ground voltages provided as shown in step 105'. Test engines 29 and chips 28 are now tested for shorts, as shown in step 106a. Any shorted test engines 29' or shorted integrated circuit chips 28' (step 106b) are disconnected from membrane 20, as shown in step 106c. A scheme for selectively connecting or disconnecting test engines and chips is shown in FIGS. 3a–3e. Once all shorts have been disconnected, testing resumes at step 105 of FIG. 1a.

Connections between wafer 26 (including chips 28 and test engines 29) and membrane 20 are preferably made with a thermocompression bonding tool that cuts one side of wire 22 extending over opening or via 30 in membrane 20 and makes thermocompression bonds between ribbon connector 31 and chip pad 32, as shown in FIGS. 3b and 3c. Metal wiring level 22 on membrane 20 is formed of a high conductivity metal such as copper or gold, is typically in the range of about 3 microns to about 30 microns thick. More preferably, the thickness is in the range of about 18 to about 20 microns. For chips drawing high current, the thickness can be 100 um or greater. Wafer pads 32 are preferably aluminum wire bond pads to receive the thermocompression bonds. Other connectors, such as gold bumps, C4 solder bumps, or conductive polymer bumps, can also be used. Stress relief loop 34 is provided in bonding the Cu/Au wire segment 36 of ribbon connector 31 to provide reliable operation over a wide temperature range. Mechanical reliability is further improved by providing silicone layer 38 to further accommodate a substantial TCE mismatch between membrane and silicon.

Since membrane ribbon connectors 31 are individually formed by thermocompression bonding of wire segments 36, connection to shorted chips found in initial wafer test step 100 can be avoided simply by leaving intact wire segments 36' to shorted chip 28' on membrane 20, as shown in FIGS. 3c and 3d. In addition, membrane ribbon connectors 31 to good chips 28 remain accessible after their formation, and, therefore, membrane ribbon connectors 31" can be cut and removed to open contact and disconnect chips 28" that short during test or burn-in, as illustrated in FIG. 3e. Cutting is accomplished with a laser cutting tool or with a mechanical cutter. Alternatively, fuses can be included in the membrane and connectors such as solder bumps or conductive polymer bumps used between membrane and wafer. Fuses provide advantage in that disconnection can be accomplished either by laser cutting or by relying on a high current to automatically open fuses. Other disconnect schemes are described herein below.

Figure 4:
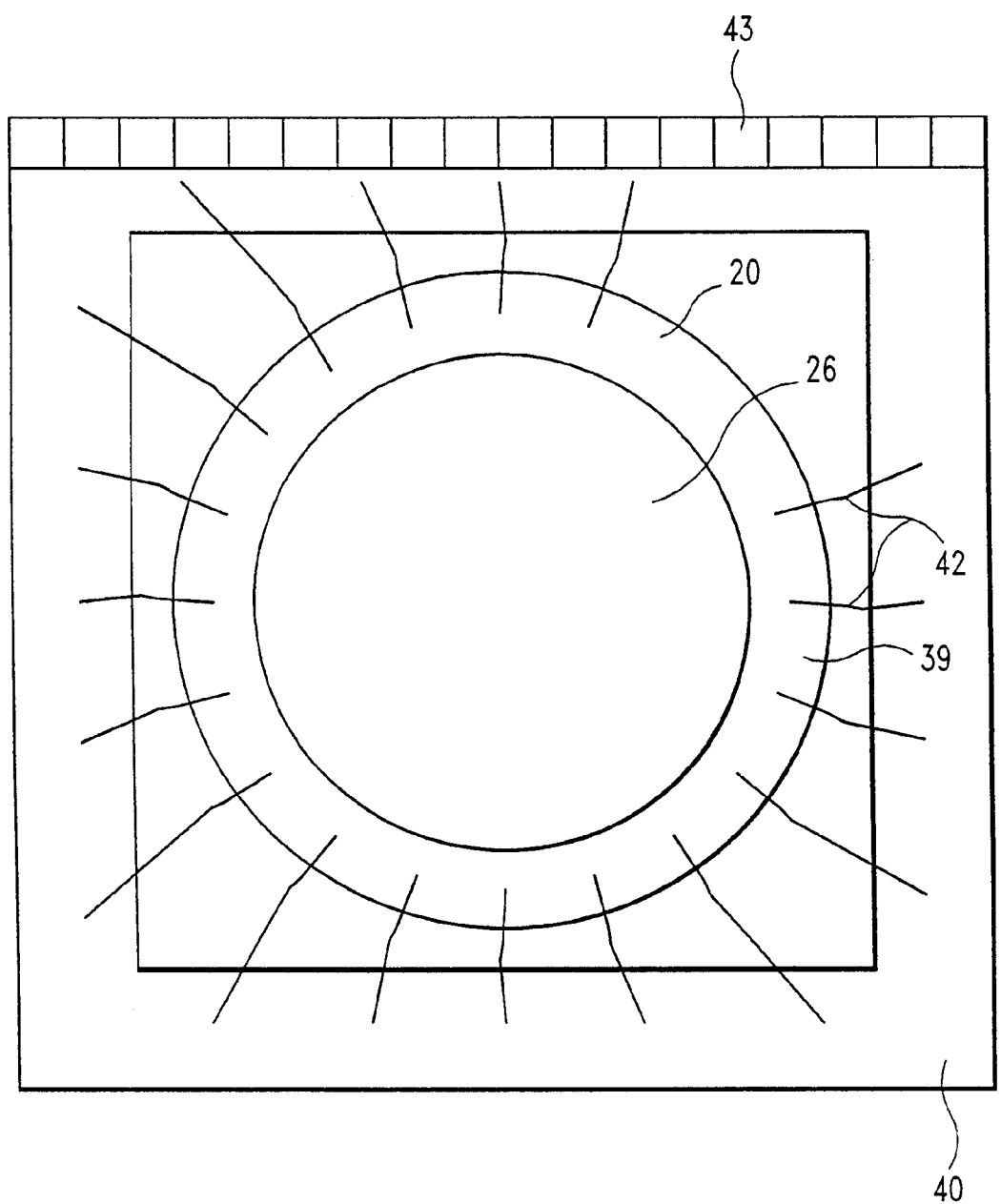
FIG. 4 is a top view of a burn-in card connected to a membrane of the present invention which is mounted on and connected to a wafer.

Membrane 20 is formed of polyimide or Teflon and preferably has an area larger than that of wafer 26, as shown in FIG. 4, to provide space along periphery 39 of membrane 20 for connection to test card 40 through connectors 42. Power, ground, and signal contacts are provided to test card 40 through edge connections 43.

In attaching step 103, membrane 20 is first aligned to wafer 26 and then bonded to wafer 26 with adhesive layer 44, as shown in FIG. 3b. Preferably, adhesive layer 44 is a thermally activated adhesive, such as silicone or Ditak, a high temperature thermoset polymer. Adhesive 44 is provided as a sheet with vias 30 preformed. Vias 30 are on the order of about 100 microns square. The adhesive sheet can be mounted to membrane 20 first, and then membrane 20 with the adhesive is mounted on wafer 26. Alternatively, adhesive can be mounted on wafer 26 and then membrane 20 mounted. After membrane 20 is aligned to wafer 26 it is held in place with a fixture. Wafer 26 and membrane 20 are then heated to a temperature in the range of 100C. to 180C. to bond insulation 46 on wafer 26 to membrane 20.

Silicone adhesive 44 mechanically connects membrane 20 to wafer 26 and provides a low modulus compliant interface there between. Adhesive and membrane together provide a low modulus compliant interface between chip and a printed circuit board or other substrate to which the chip is later attached, reducing stress between chip and PC board without the need for temperature coefficient of expansion matching. Ribbon connectors or electrically conductive adhesive provide a low modulus and compliant electrical interface. Thus, both mechanical and electrical connection is formed while avoiding the need for thermally matched materials to accommodate large temperature change from room temperature to burn-in temperature.

Figure 5:
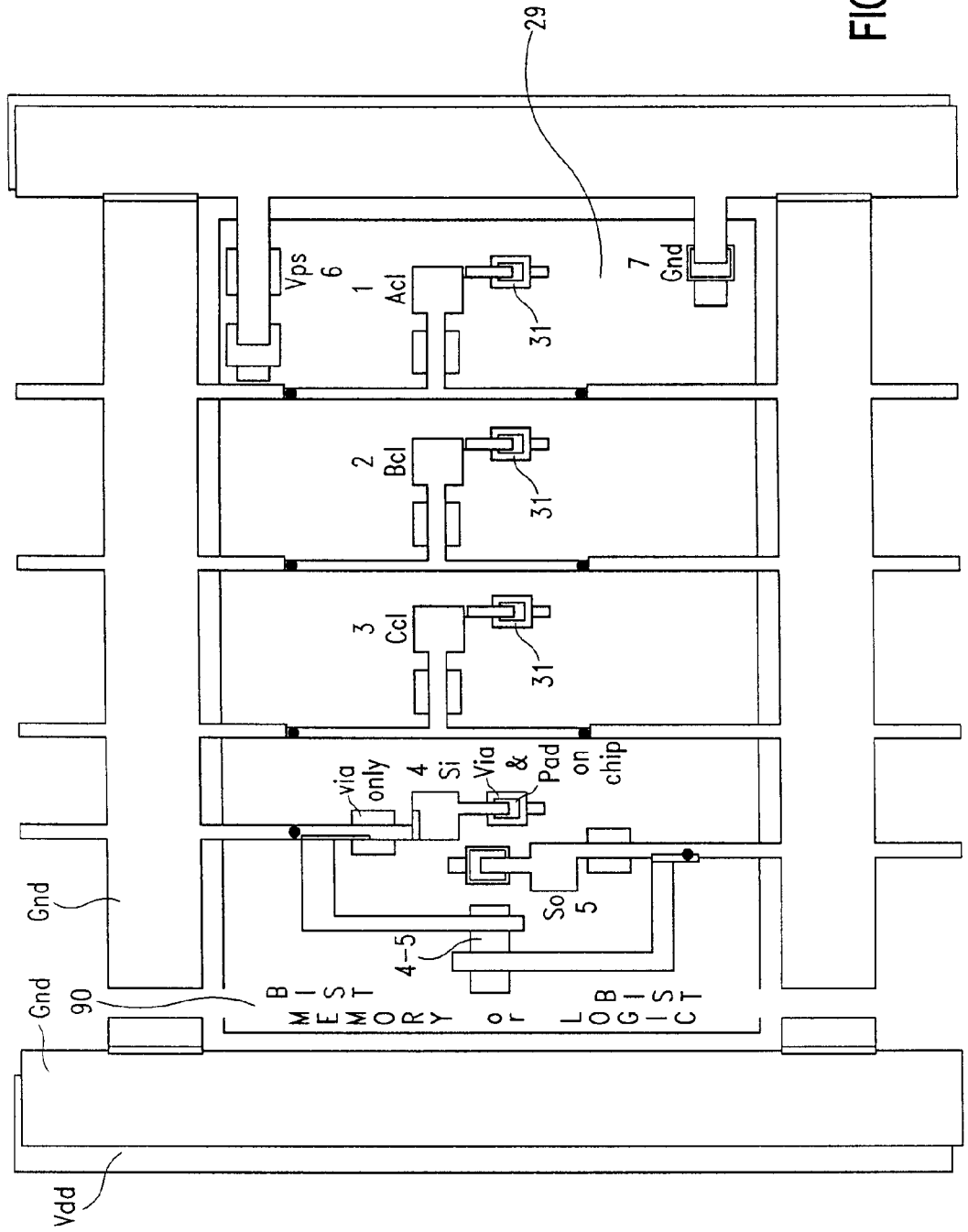
FIG. 5 is a top view of a portion of a membrane of the present invention mounted on a test engine showing connections thereto.

FIG. 2 shows a top view of two-level interconnect wiring on membrane 20. Power supply voltage Vps is provided to all chips 28 in parallel through Vps rail 6' extending vertically on membrane 20 as drawn. Ground (Gnd) rail 7' is provided on all sides of chip 28. All other connections to test engine 29 are made from the same wiring level in membrane 20 as Vps 6', as shown in FIGS. 2 and 5. Five wires are needed to supply a test engine including three test engine clocks and the two scan chain wires, and these are shown linking each test engine with corresponding peripheral wafer pads 1–5 on membrane 20. Lines for power supply (Vps, 6) and ground (Gnd, 7) extend on membrane 20 above kerf region linking chips 28. Test engine wires 1, 2, 3, 4, 5 extend from pads 1–5 located along periphery 39 of membrane 20 to test engines 29 provided at each chip 28. The five test engine wires extend through vias and go below GND 7 on the same level as Vps 6'.

Figure 3G:
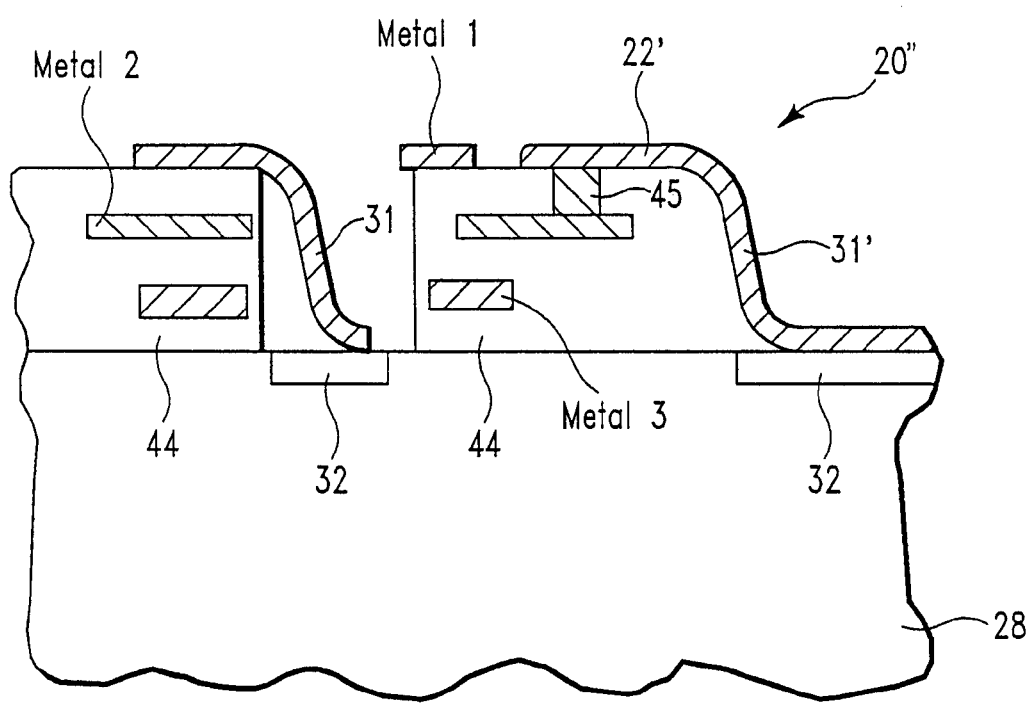
FIG. 3g is a cross sectional view of a membrane connected to a wafer in which the membrane has several levels of metal;f

FIG. 3g shows a cross sectional view illustrating how two or three levels of wiring are implemented in membrane 20 for connection to pads of chip 28. Top level metal 22' (metal 1) is used to form thermocompression ribbon bond 31 to pad 32. Second and third metal layers (metal 2 and metal 3) are connected to top level metal 22' through vias 45 for connection to pad 32 by means of ribbon bond 31' extending from top level metal 22'. Metal 2 and metal 3 can be formed of copper or copper gold.

Figure 6:
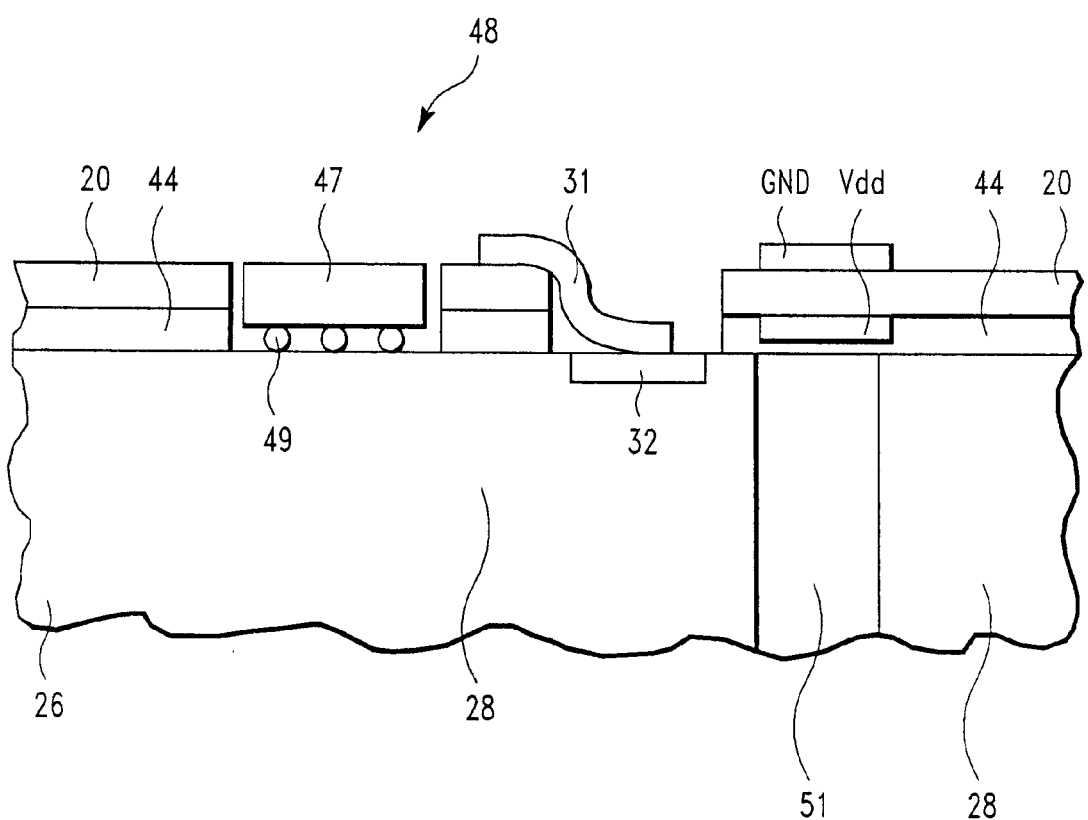
FIG. 6 is a cross sectional view of a chip scale package of the present invention with a second chip or electronic component mounted thereto.

As shown in FIGS. 2 and 6, the power supply and ground lines on membrane 20 are about as wide as kerf 51, which is typically 150 micrometers. Although shown extending over the kerf for clarity of illustration, the power and ground lines can be made much wider if needed to reduce IR drops. The width of lines is limited by the need to provide access to the surface of chip 28 for other connections. Synchronous DRAM chips draw about 100 mA during normal operation. An entire wafer with 200 chips will draw about 20 A. During burn-in current is about 1.5 times higher. A pair of 100 micron thick by 1 mm wide copper wires 6', 7' overlapping kerf 51 for power and ground with contact pads 6, 7 along periphery 39 of membrane 20 can provide 1 A during test to ten SDRAM chips along a column with voltage drops ranging from about 4 mV for the first chip to about 20 mV for the tenth chip in the column. This range is about 6 mV to 30 mV during burn-in. Thus, substantial voltage uniformity can be provided across wafer 26 while chips are being tested or burned-in running at full speed. For high current logic chips in test mode, wider and thicker copper wiring is provided on membrane 20 to avoid substantial IR drops in the wiring and variation in the voltage applied to the chips. Alternatively, greater voltage uniformity can be achieved by providing ground and power taps at several points along wires 6', 7'.

Alternatively, additional product-level wiring can be on a second membrane mounted on the membrane used for burn-in and test. Connection between the two membrane layers is provided using additional ribbon connectors, solder balls or transient liquid phase bonding. The product level wiring in the second membrane permits changing the architecture of the chip from, for example, a by 4 addressing to a by 16 addressing.

As shown in FIGS. 3b–3e and FIG. 5, ribbon connectors 31 to test engine 29 permit a tool to cut and remove attached wire segments connecting the clock lines and scan chain to each test engine. Thus, test engines 29 can be reconfigured at the membrane level, as shown in FIG. 5. Each test engine 29 may now be included or it may be bypassed in the serial scan path shown in FIG. 2. For example, if there is a bad chip or a bad test engine, connections of clock lines 1, 2, 3 and scan chain lines 4, 5 to that test engine 29 are opened by laser cutting ribbon connectors 31. $S_i$ and $S_o$ are then reconnected by bonding a ribbon bond from each on pad 4-5 to provide a continuous scan chain for the rest of wafer 26. Thus, ribbon connectors 31 permit connection to a particular test engine to be avoided, cut or bypassed at any time, such as at the beginning of test or burn-in, during burn-in, or after burn-in.

FIG. 6 shows wafer 26 with second chip 47 stacked on first chip 28, the two chips forming a desired function, such as memory and logic. Several chips or other components, such as capacitors or resistors, or even light emitting or receiving chips can be stacked in this manner. The stacked components on wafer 26 may be accommodated in windows 48 in membrane 20 (scan chains, etc. are routed around the windows as needed) or on top surface of membrane 20. Test engines 29 in one or both chips perform the test and burn-in functions. If in face to face arrangement, all connections to smaller chip 47 are made through larger chip 28. Thus, wafer 26 can have both membrane 20 and additional electronic components, such as chip 47 attached to each chip site. Signals to test, burn-in, and operate chip 47 are brought in to that chip through chip 28. A test engine for testing chip 47 can be located on either chip.

Stacked chip 47 (or another electronic component) is attached to chip 28 with connectors, such as solder bumps 49 or wire bonds. A failing stacked chip 47 can be removed by heating to reflow the solder, removing solder adhering to the good chip, then replacing with another chip, and retesting and burning-in. In the case of a chip level package, dicing the wafer/membrane combination results in a stacked multichip packaged product with chips that have been fully tested and burned in. Alternatively, membrane 20 can be removed to provide a chip stack formed with fully tested and burned-in chips.

Figure 7A:
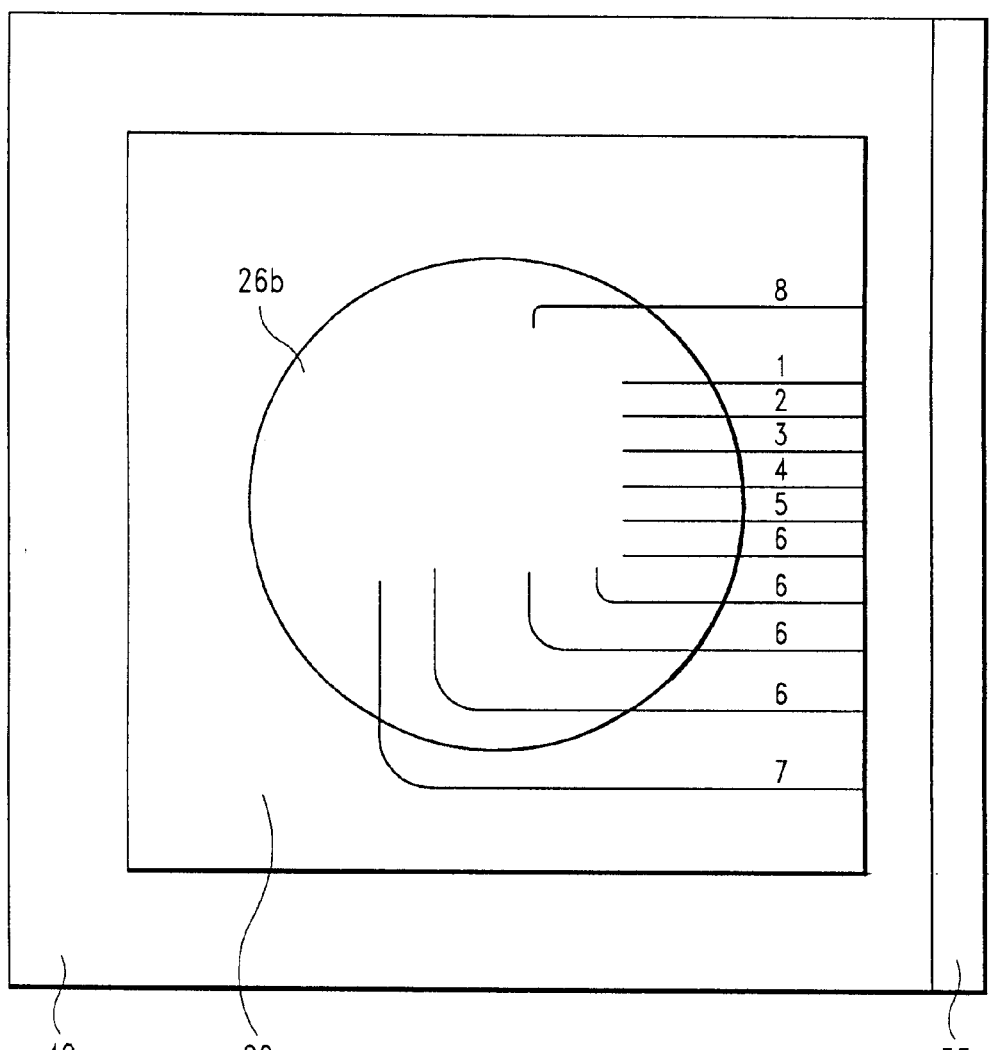
FIG. 7a is a top view of a burn-in card connected to a membrane of the present invention which is mounted on and connected to a wafer, and the wafer is on a hotplate for burn-in stress.
Figure 7B:
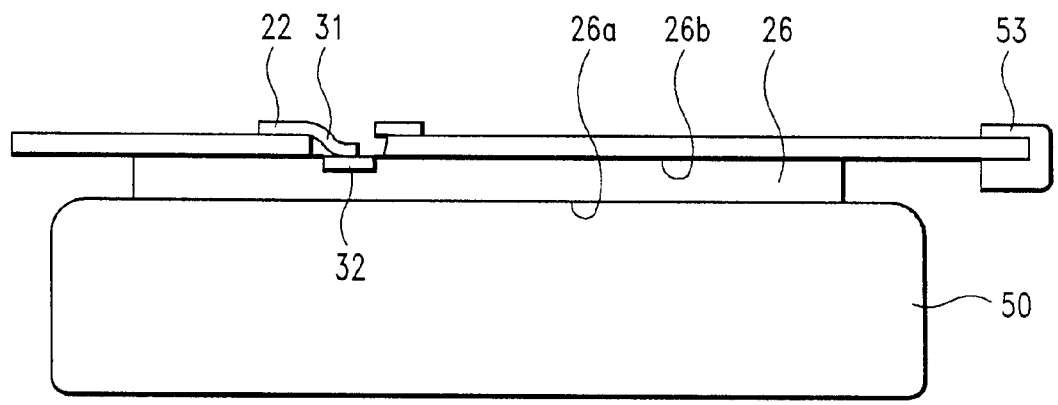
FIG. 7b is a cross sectional view of a burn-in card connected to a membrane of the present invention which is mounted on and connected to a wafer, and the wafer is on a hotplate for burn-in stress.

During burn-in step 107 back surface 26a of wafer 26 is heated on hot plate 50. Access to front surface 26b of wafer 26 is therefore still available for disconnecting shorted chips during elevated temperature burn-in, as shown in top and cross sectional views in FIGS. 7a, 7b. The ribbon thermocompression connector scheme described above allows power, ground, and signal lines for each chip to be individually accessed by a laser or other cutting tool to open selected membrane ribbon connectors 31 if a high current defect is found on one or more chips. Membrane 20 is contacted for external connection through membrane contactor 53.

Figure 7C:
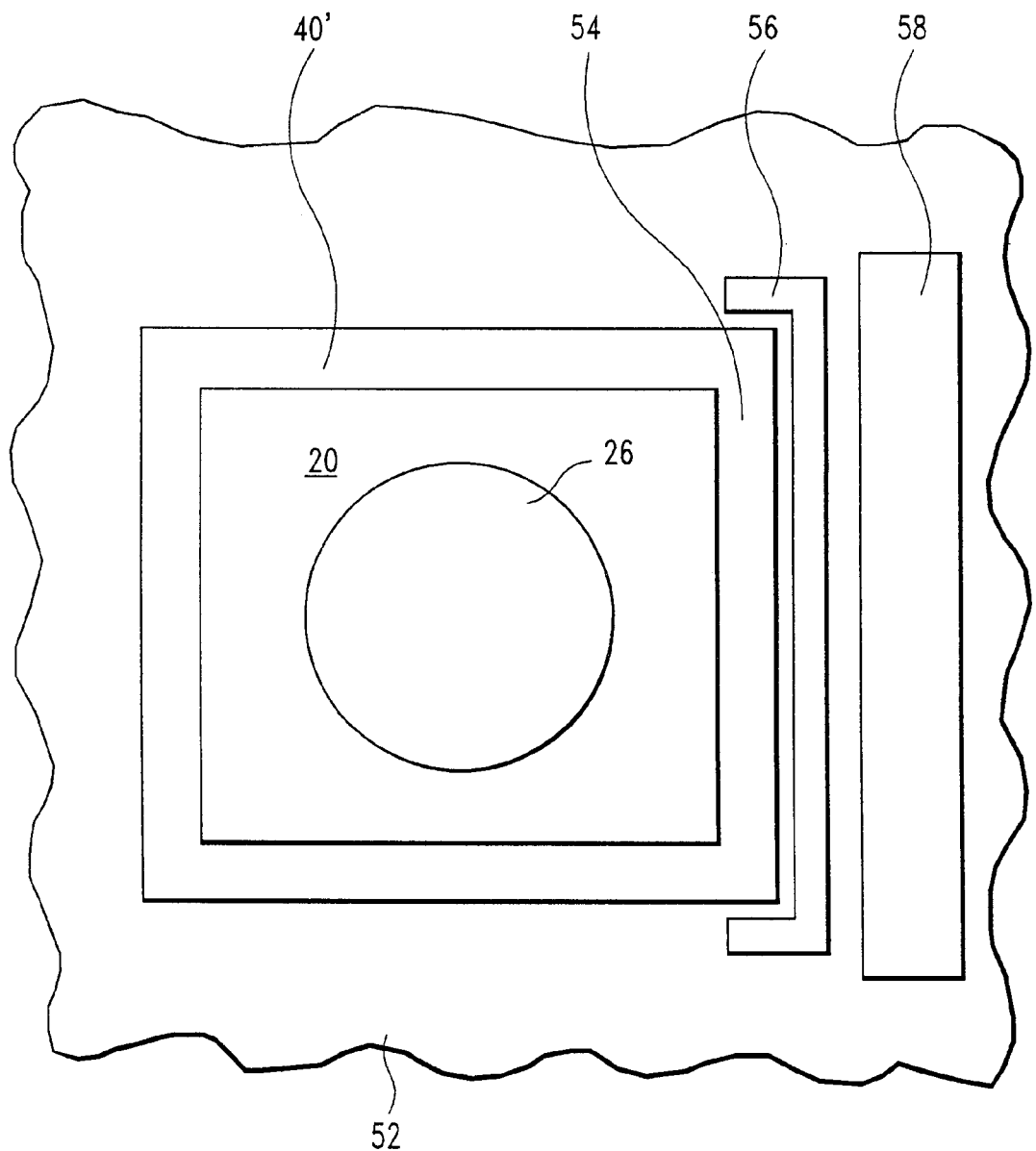

Alternatively, a greater density of wafers is achieved during burn-in if test cards 40' to which wafers 26 are mounted are stacked in oven 52, as shown in FIG. 7c. Test cards 40' have edge connectors 54 for plugging into socket 56 of an oven tester or burn-in card 58.

In either case, parametric tests and functional test patterns are applied at elevated temperature using on-wafer test engines 29 to provide in-situ burn-in. Further testing can be done after burn-in is complete, a yield map is generated, and redundancy allocations are performed.

Figure 8:
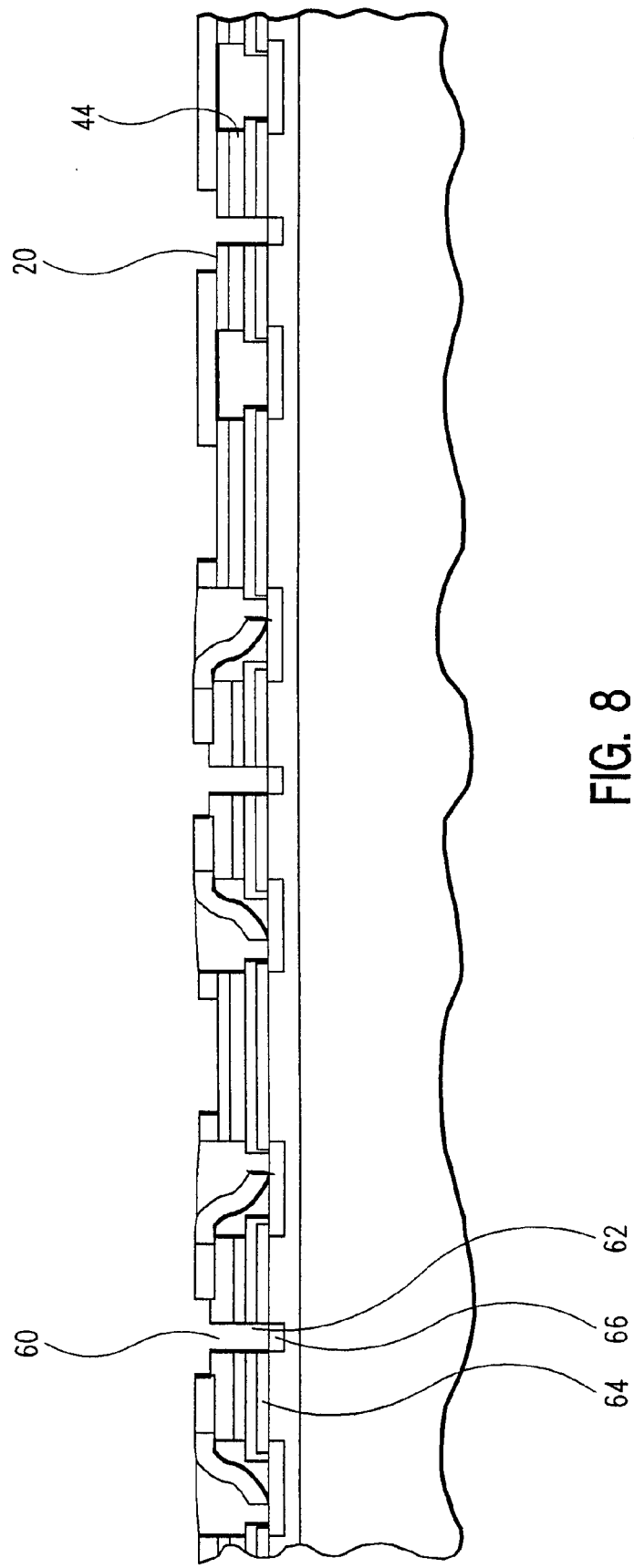
FIG. 8 is a cross sectional view of a membrane on a wafer, the membrane having windows for accessing fuses on the wafer for implementing redundancy.

Redundancy is implemented after burn-in by opening fuses on each chip. Windows 60 in membrane 20 aligned over windows 62 in chip insulator 64 are used for access to laser delete fuses 66 to repair burn-in caused defects as shown in FIG. 8. Thus, burn-in fails are repaired before dicing, recovering a significant number of chips that would otherwise be scrapped. As an alternative to laser-blown fuses, other memory elements can be used, including such non-volatile memory elements as ROM, EPROM, EEPROM, and flash memory. Also electrically programmable fuses or fuses in which impedance is shifted can be used. For these device no window in membrane 20 is needed; therefore these devices permit redundancy to be implemented after the chip has been packages.

In addition to providing connections to wafer 26, wiring level 22 on membrane 20 also has solder bumps 70 (FIG. 3d) for interconnecting chip scale package 72 to the next level of assembly, such as printed circuit board 74 (FIG. 3f) after wafer 26 and membrane 20 are diced. Chip scale package 72, includes chip 28 and diced membrane 20' which have identical length and width dimensions since they were both cut in the same dicing step. Solder bumps 70 can be added before dicing, as shown in FIG. 3d, or they can be added to diced chips.

For providing a chip level package, preferably, membrane 20 has a coefficient of thermal expansion that is closely matched to the next level of assembly, such as a printed circuit board 74 or other multi-chip substrate. Membrane 20 is preferably sufficiently thick and pliable and membrane connectors 31 have sufficient stress relief looping to provide connection with pads 32 on chips 28 that accommodates substantial thermal mismatch stress. Thus, the chip-membrane combination diced from wafer 26 and membrane 20 form chip scale package (CSP) 72 ready for high reliability direct mounting to printed circuit board 74, as shown in FIG. 3f. Printed circuit board 74 can have a substantially different thermal expansion coefficient than that of silicon chips 28 because membrane 20' provides sufficient compliance to accommodate thermal mismatch.

Membrane 20 thus has dual purpose. It is used on the wafer to provide connections and disconnections for test and burn-in. It is then used as the package for each chip into which the wafer is diced. After dicing these packages are ready for direct attachment to printed circuit boards. There is no need for conventional bond and assembly of individual chips onto substrates or lead frames before mounting on a printed circuit board. Furthermore, there is no need for final module test after dicing. All these steps have been fully performed at wafer level and need not be repeated after dicing, saving substantially on time and cost for testing and packaging. Although illustrated mounted on printed circuit board 74, membrane/chip package 72 can also be shipped as a fully tested module before mounting.

If bare known good die (KGD) are desired, membrane 20 can be removed from wafer 26 after test and burn-in are complete and good chips have been designated, as shown in step 125 of FIG. 1b. Membrane 20 can be peeled or dissolved off of wafer 26. Conductive adhesive is used to form electrical connectors between membrane 20 and wafer 26 (instead of ribbon connectors 31 of the previous embodiment). These bonds can be dissolved off leaving no damage to the chips. Thus, for KGD the membrane attachment is temporary. The ability to disconnect shorted chips is provided by laser cutting or mechanically cutting lines on membrane 20 leading to the conductive adhesive connector. These lines can extend over vias to make the laser or mechanical cutting task easier.

In addition to the ribbon connectors and the conductive adhesive described herein above, other contacts, such as solder or gold metal bumps can be used for contact between the membrane and the chip. In this case alternate schemes to disconnect shorted chips are used, such as fuses, electronic fuses and antifuses, and gating transistors.

In another embodiment, where bare known good die are desired, two different pads are provided for contacts on the wafer. For example, aluminum pads may be provided for test engine connection pads and some of the chip power and ground pads while un-reflowed solder is provided for final chip functional pads and other power and ground pads. For test and burn-in the membrane is attached to the test engine and some of the power and ground pads with ribbon bonds. After burn-in the ribbon bonds are cut and the membrane is removed. The taller reflowed solder bumps are then used for the next level of assembly. Alternatively, wider or duplicate aluminum pads can be provided, and the chip can be wire bonded to the next level of assembly using space on the wider pads or using the duplicate pads.

Figure 9:
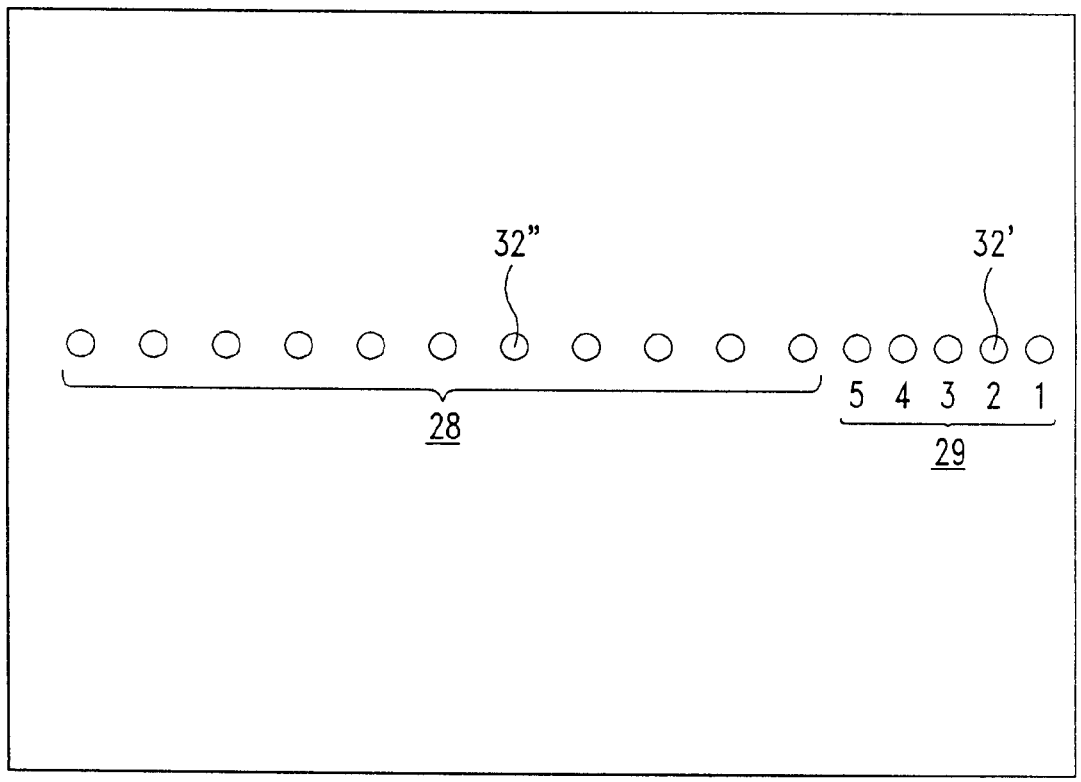
FIG. 9 is a top view of a chip showing contact pads for product connections and for test engine connections.

The attachment of membrane 20 for the KGD embodiment is exclusively to test engines 29 and chip power and ground pads. For the chip scale package embodiment, the attachment between chip and membrane is permanent and all chip contacts are brought out through membrane 20. Thus, for the chip scale package, membrane 20 is electrically connected both to pads 32' of test engines 29 and to all chip functional pads 32" at wafer level (see FIG. 9). Connections to functional pads 32" are not used during test and burn-in since chips can be fully tested and burned-in exclusively through connections to pads 32' of test engines 29. Chip functional pad 32" connections are used when membrane 20 is connected to the next level of assembly.

Metal and conductive adhesive bumps on membrane 20 permit probing membrane 20 with a high level of force using a probe such as a wafer-sized cobra probe or a dendrite probe. After test and burn-in, the same bumps can then be used for permanently mounting the chip scale package.

Figure 10A:
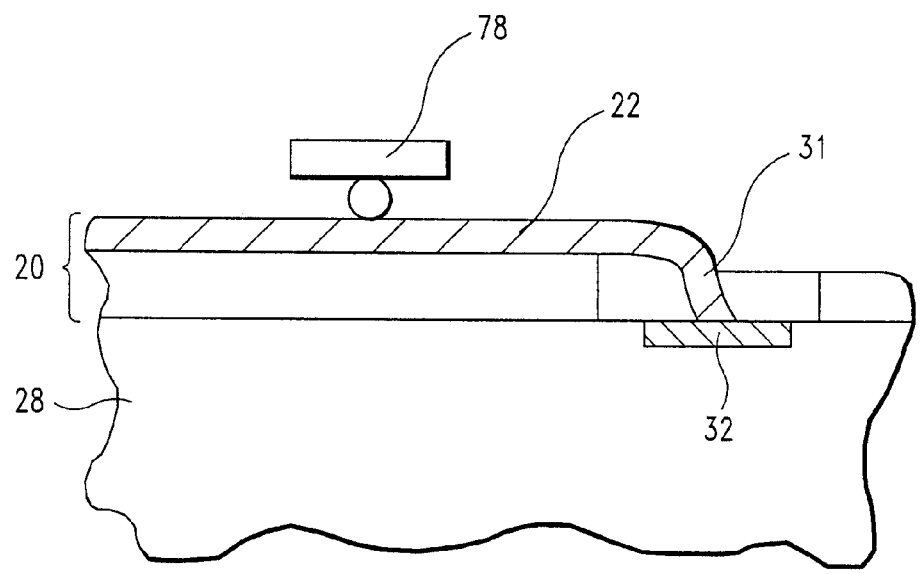
FIGS. 10a–10b are cross sectional views of alternate structures for implementing decoupling capacitors on a membrane on a wafer.
Figure 10B:
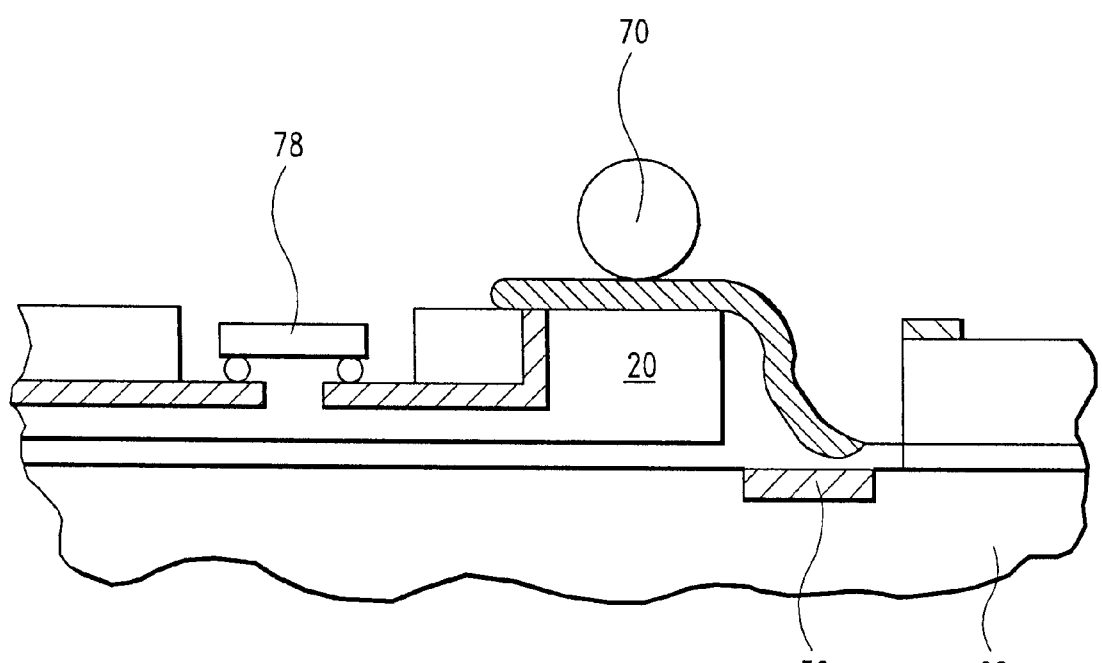

Each test engine 29, running within or very close to each chip, provides signals for burn-in and for high speed testing. To provide for the high speed test, decoupling capacitance is provided on each chip 28 as mentioned under the description of FIG. 6. Alternatively discrete decoupling capacitors 78 can be temporarily connected to membrane 20, as shown in FIG. 10a, or permanently connected to membrane 20 for a chip scale package, as shown in FIG. 10b, permitting chips 28 to run in parallel at functional speed at wafer level.

For DRAM testing, where current is relatively low, power and ground connections can be made through narrow lines extending through membrane 20 above kerf regions 51 (FIG. 6) between chips 28, leaving plenty of room for contacts to the chips. To prevent a shorted chip from detracting from the capability of testing other chips on wafer 26, each power pad has a disconnect capability as described herein above and illustrated in FIG. 3e.

The test engines significantly simplify connection for wafer burn-in by reducing signal pad connections. The membrane interface further permits these few pads to be much larger or otherwise more easily accessible than pads on wafer. Furthermore, all signal connections to the chips being tested are through a few lines to test engine 29, as shown in FIG. 5 and FIG. 2. Thus, there is no probing of the actual chip signal pads and the number of connections to the wafer are substantially reduced.

As indicated above, membrane 20 can be used for initial wafer level test. In this case all test engines and power and ground of all chips on wafer 26 are initially connected to membrane 20 as shown in step 103'. Shorted chips 28' or test engines 29 connected to shorted chips 28' are then disconnected from membrane 20 based on a test before burn-in as shown in step 106c of FIG. 1a' and in FIG. 3e and FIG. 5. If test engines 29 are not connected or are disconnected from membrane 20, the tester and stress chamber must be programmable to accept a variable number of test engines within a particular chain.

Figure 11A:
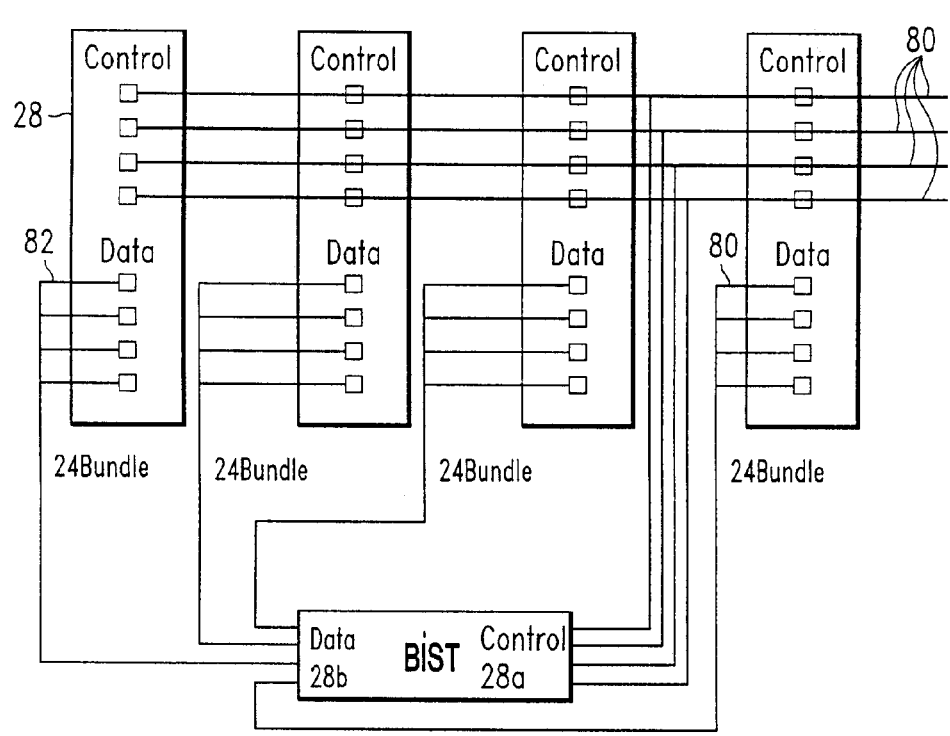
FIGS. 11a–11b are top views showing wiring for sharing a test engine among chips on a wafer for parallel and serial testing.
Figure 11A:
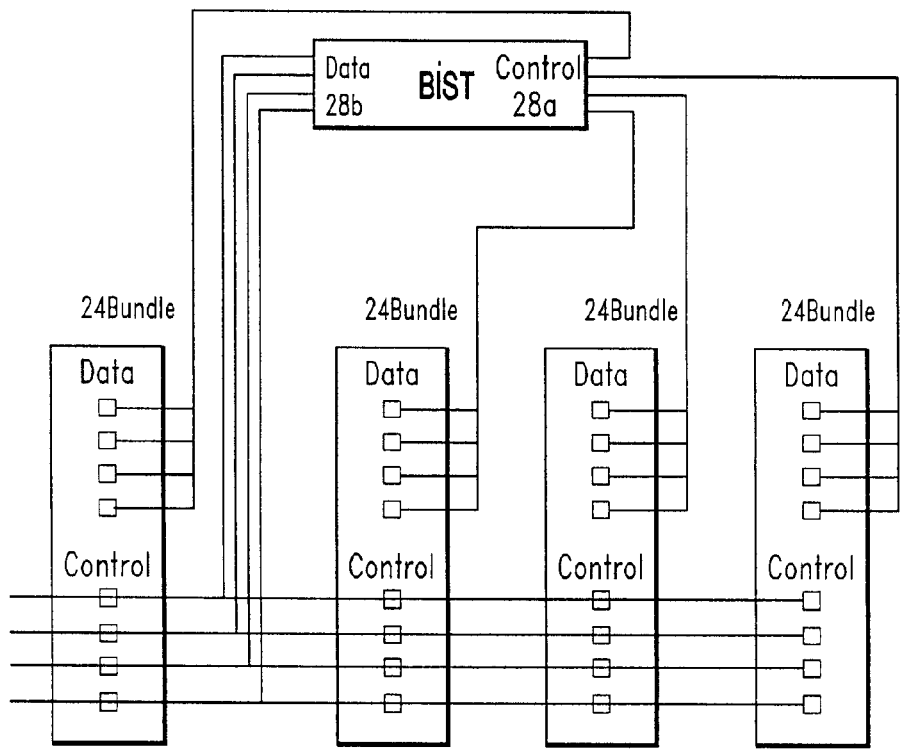
Figure 11B:
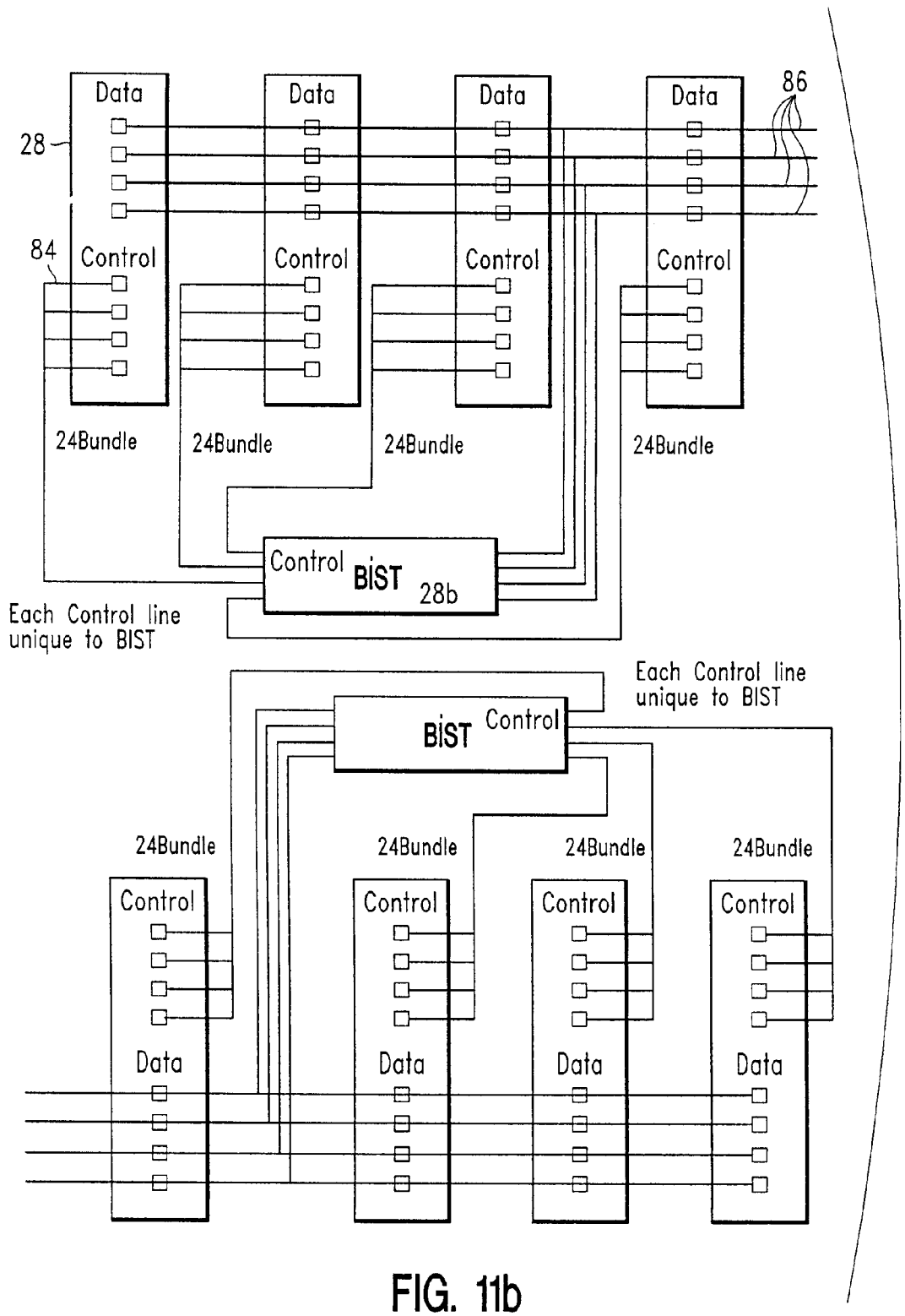

A single test engine 29a, 29b can be shared among several chips 28 as shown in FIGS. 11a–11b. These sharing chips 28 are connected to shared test engine 29a, 29b through wiring on membrane 20. Chips connected to a common test engine can be tested in parallel (FIG. 11a) or they can all be tested in series (FIG. 11b). For parallel testing, control inputs, such as RAS, CAS, clocks, write enable, and addresses, are each provided from test engine 29a to all sharing chips 28 along common control lines 80. Test patterns go out from test engine 29a to each chip 28 along individual data lines 82. Data subsequently read from each chip goes back to a comparator for that chip in test engine 29a along these individual data lines 82, and this data is fed back to test engine 29a from all chips at the same time.

For serial testing individual control lines 84 from test engine 29b are provided for each chip 28. Chips 28 are tested sequentially by tristating data I/O lines 86 to all chips except the one from which data is being read to test engine 29b.

If a chip failure during test or burn-in results in a short and causes high levels of power dissipation, the disconnect structure between chip 28 and membrane 20 described above can be used to disconnect power and other membrane connections to that chip. Disconnection can be accomplished during burn-in at elevated temperature or the wafer can be removed from burn-in for the disconnection step.

Figures 12A, 12B:
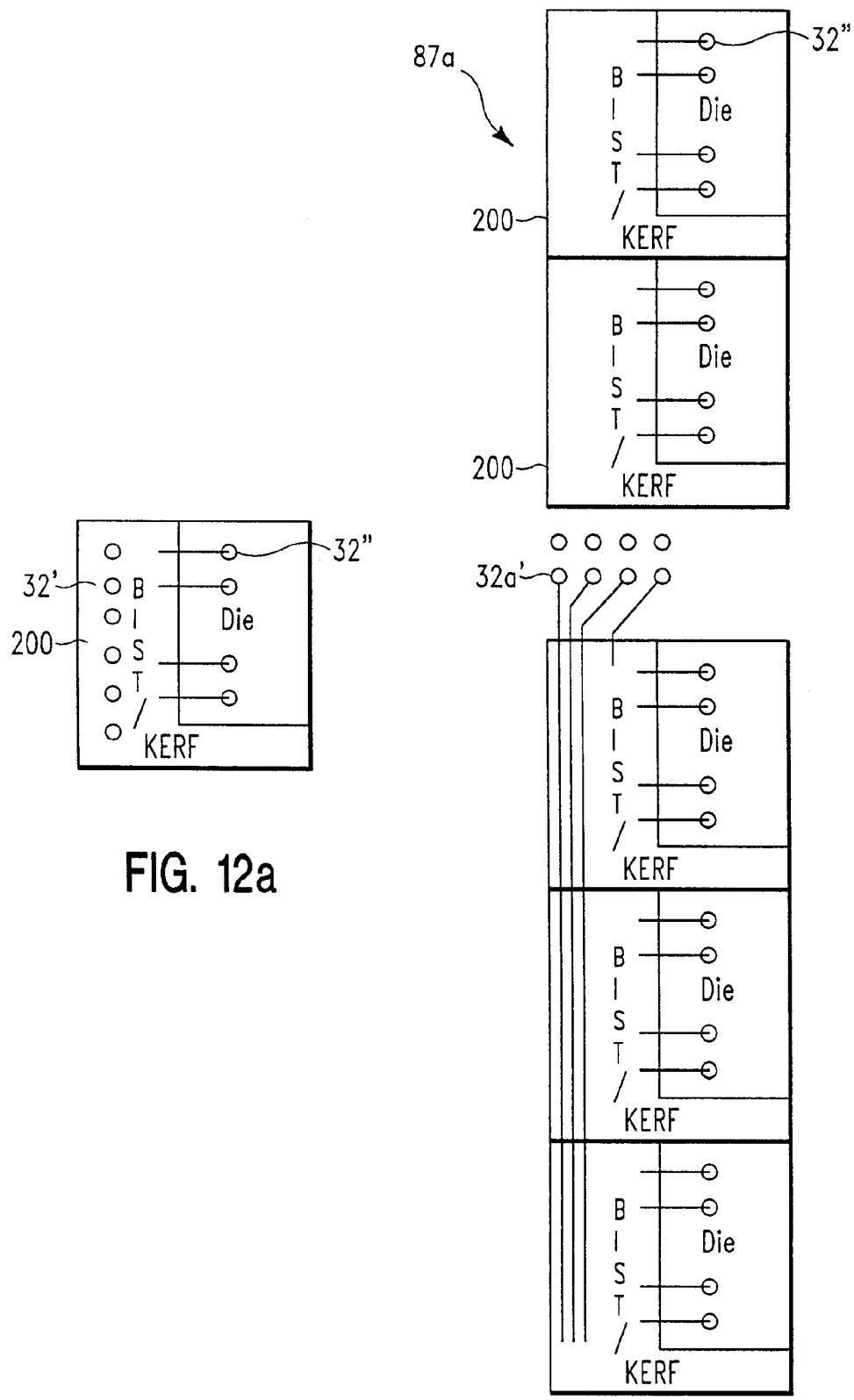
FIG. 12a is a top view showing a test engine serving a single chip.
FIG. 12b is a top view showing a column of chips each with its own test engine, but the test engines all share a set of pads.
Figure 12C:
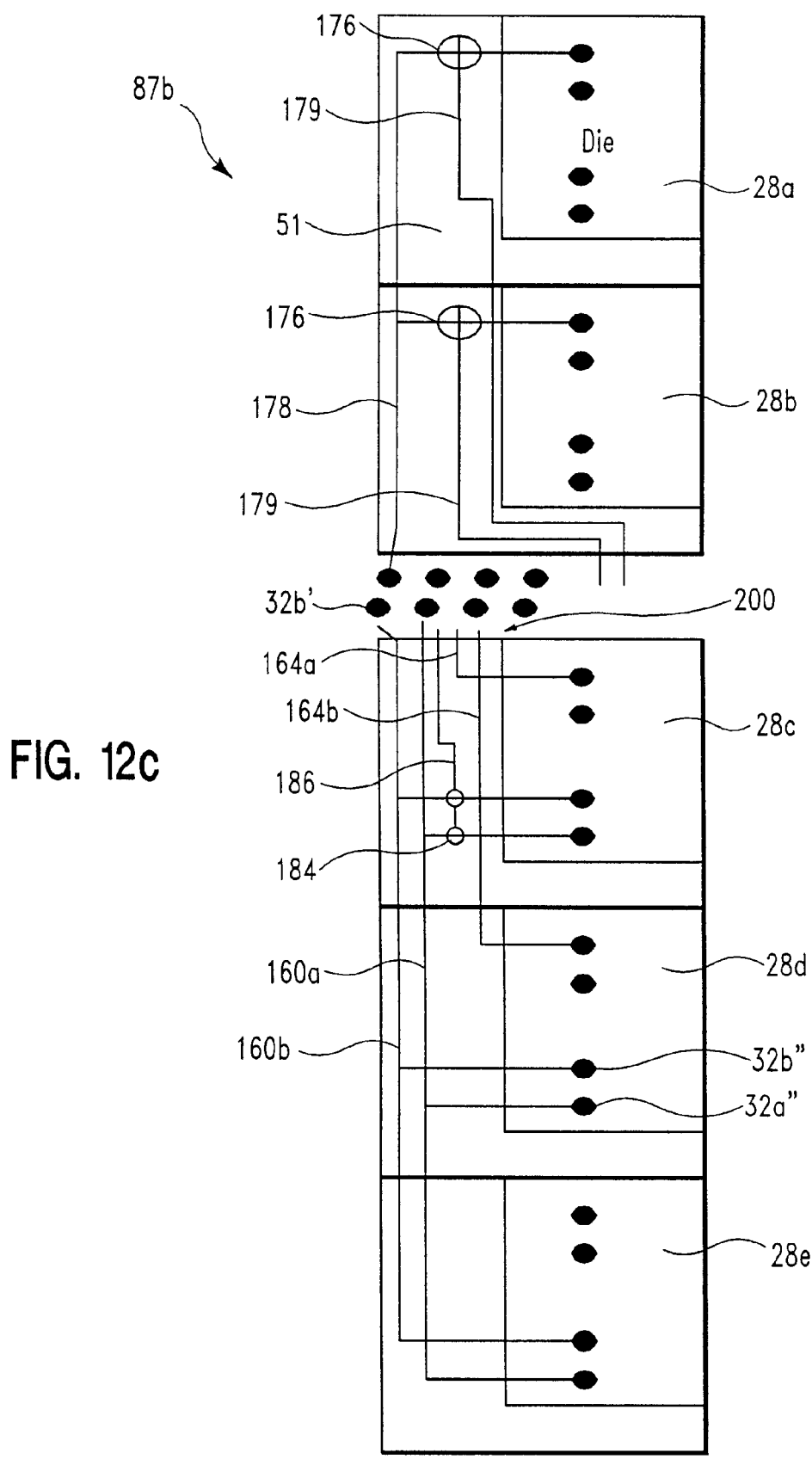
FIG. 12c is a top view showing a column of chips that are sharing a single test engine.

Each test engine 29, such as the processor-based test engine 200 shown in FIGS. 12a–12c, can also be a tester for each single chip 28 on wafer 26, as shown in FIG. 2 and FIG. 12a. Test engine 29, 200 can be located within each chip (FIG. 2) or it can be located in space between chips (FIG. 12a). When located on chip, the test engine is a BIST engine. Connection between a test engine located outside a chip and that chip is preferably made through membrane 20 to avoid a corrosion path along wiring extending to the edge of a chip.

Figure 21:
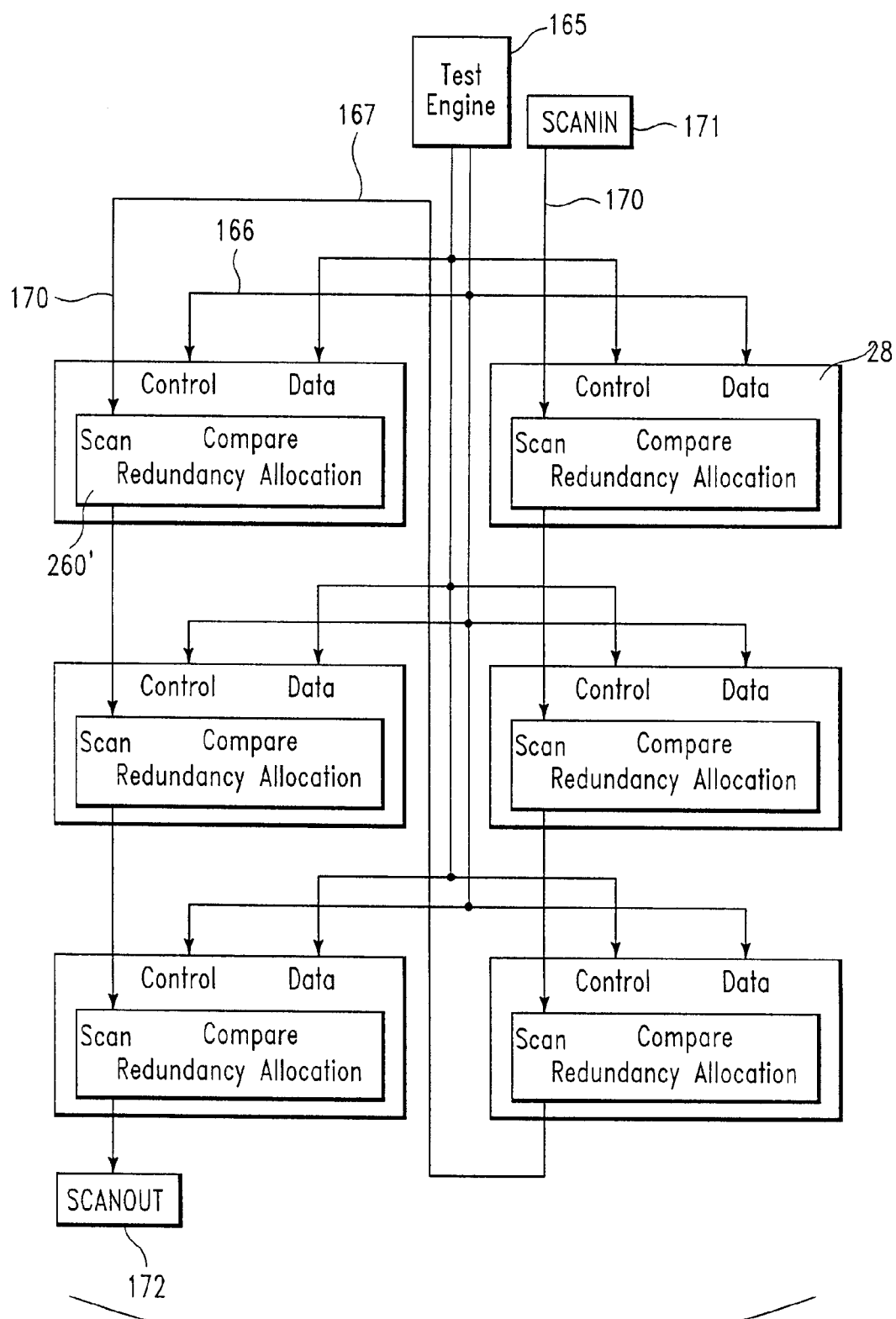
FIG. 21 is a top view showing shared and distributed portions of a test engine circuits on a wafer.

Contact is made through test engine pads 32' located at each test engine 200, as shown in FIG. 12a or to common set of test engine pads 32a' connected to a group of test engines 200, such as those arranged along column 87a of FIG. 12b. In this case clock and scan in/scan out lines are in common for test engines and all these test engines run in parallel. Alternatively, each test engine 200 can be a tester for a group of chips, such as entire column 87b of chips 28a–28e on wafer 26, as shown in FIG. 12c and contact is made to common set of pads 32b'. Shared test engines 200 can be connected to test other arrangements of chips on wafer 26, such as a rectangular array of chips or half a column of chips. Taking this to extreme, a single test engine can be shared among all chips 28 on wafer 26. The fewer test engines 29, 200 on wafer 26, the simpler probes can be to contact wafer 26. On the other hand, fewer test engines can mean less parallel testing of chips, though, as shown in FIG. 11a and FIG. 21, a high degree of parallel testing is achievable with shared test engines.

Each test engine 200 reduces the number of pins that need be used to probe the chips of a wafer in two ways first. First, a single test engine 200 can be connected to several chips 28 (FIG. 12c). And second, only about 6 probes are needed to contact signal pads 32' of each test engine 200 for testing each chip 28 to which that test engine is connected. Thus, test engine 200, whether individual or shared, provides for a substantial reduction of the input and output probes required for testing the chips on a wafer.

The present inventors have found advantage to provide a test engine located on each chip of the wafer since a test engine on each chip provides a testing capability that can be used to test that chip during its life in a system.

Figure 13:
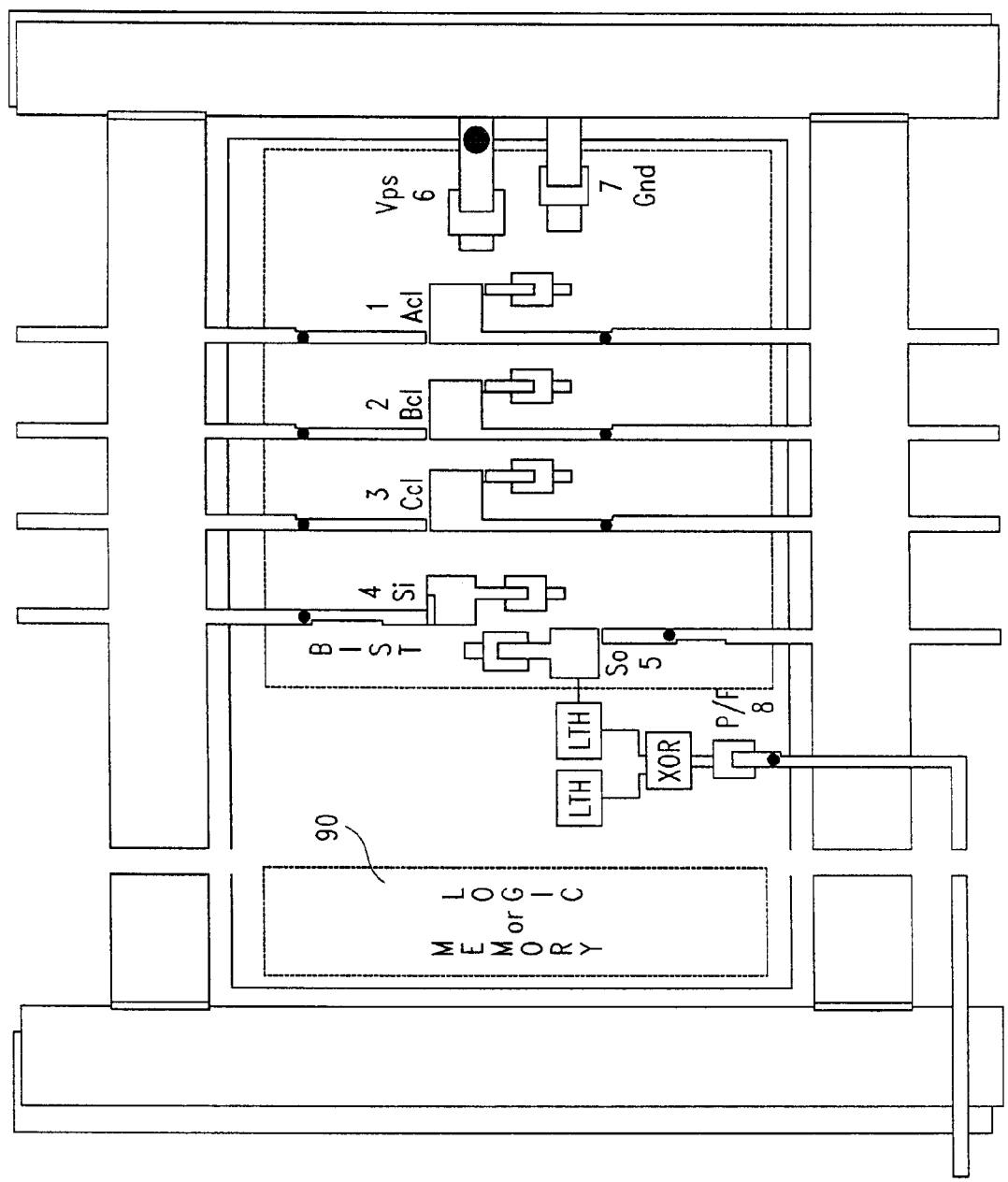
FIG. 13 is a top view of a portion of a membrane of the present invention mounted on a test engine showing connections thereto, the test engine having a circuit and a P/F pin for outputting a signal indicating a failed test.
Figure 14:
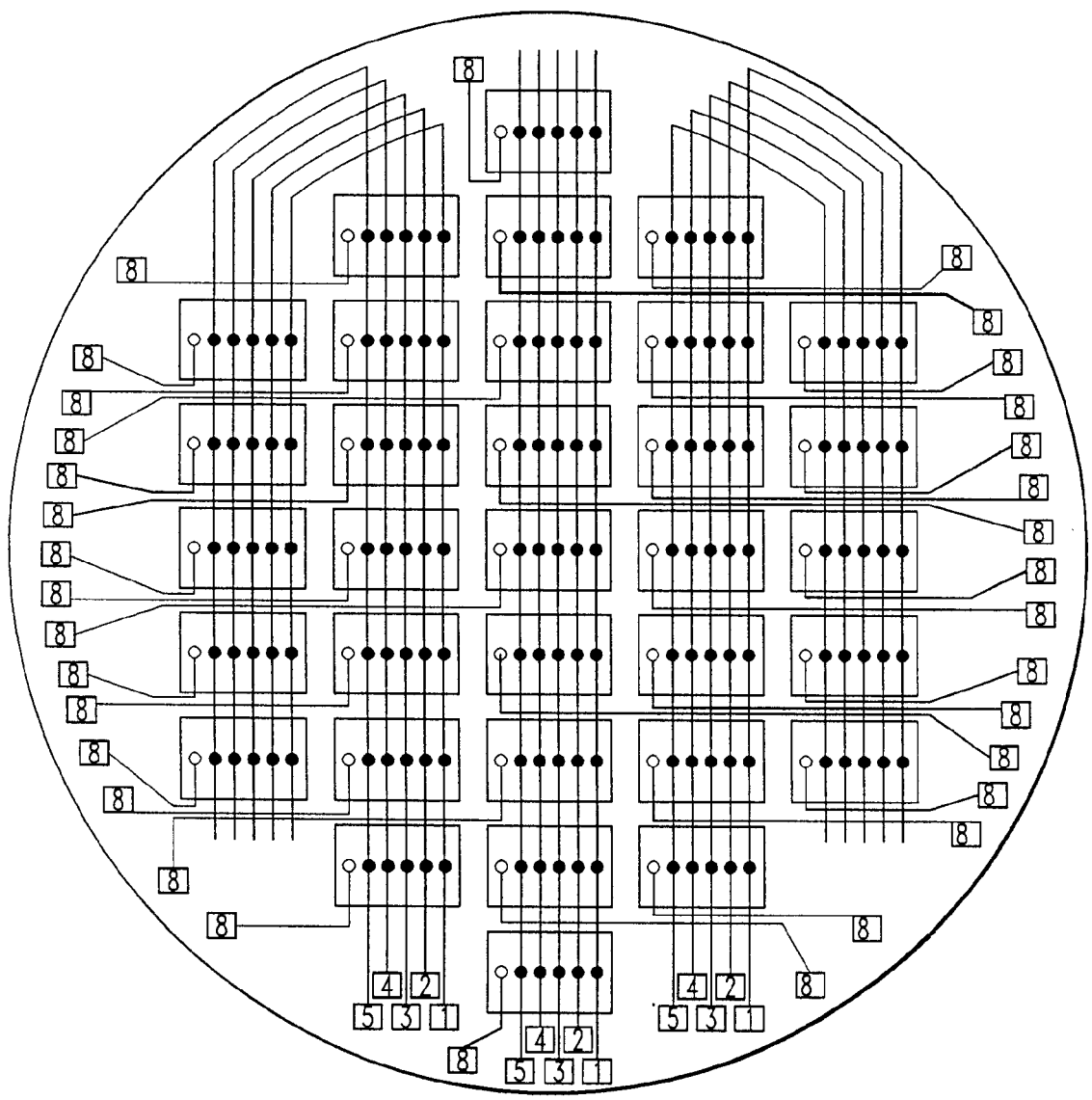
FIG. 14 is a top view of a membrane of the present invention showing wiring in the membrane and contacts to the membrane including the P/F pin of FIG. 13.

FIG. 5 shows test engine 29 on chip 28 contacted from membrane 20 with power Vps, ground Gnd, and 5 signal paths, including A clock Acl, B clock Bcl, C clock Ccl, Signal in $S_i$, and Signal out $S_o$. Test engine 29 is connected to and tests memory or logic finction 90 on chip 28 (drawing is not to scale) by providing signals along wiring $A_{cl}$, $B_{cl}$, $C_{cl}$, $S_i$ and $S_o$ on wafer 26. Test engine 29, as configured, will only give a pass or fail (P/F) at the end of the testing or burn-in through the scan path connecting test engine 29 to the various inputs of memory or logic function 90, and will not identify the failing pattern. However, if one additional pass/fail data pin P/F, is provided to each test engine 29, as shown in FIG. 13, and one additional wire (wire 8) is provided for external connection in membrane 20, as shown in FIGS. 13, 14, the failing pattern and redundancy data can be determined. Thus, in addition to power connection Vdd and ground connections GND to test engine 29 and memory or logic function 90, five additional I/O pins are needed to initialize and run the tester, and wire 8 and one additional I/O pin is needed for each test engine to up-load test results to the tester.

In cases where it is desirable to know the specific failing pattern to allocate and implement redundancy, it is necessary to provide a pass/fail indicator signal P/F at the time of the fail. FIG. 13 shows the test engine of FIG. 2 with P/F output extending to pads 8 (Vps and Gnd are omitted from FIG. 14 for clarity). P/F is generated by comparing the expected response with the actual response from the logic or memory function, as shown in FIG. 13. One P/F output pin per chip is required. When a fail is found a single bit goes out on that line. From the cycle number of that fail signal, the address of the failing bit is determined by the tester or test engine. The function being tested by the tester at that address is also known and a bit fail map for each function can be generated. The tester uses the test data to generate a yield map, allocate redundancy, and indicate which fuses on each chip need be blown to replace defective cells, word lines or bit lines with redundant counterparts. Thus, chips are repaired after burn-in.

The tester can accumulate the fail address data and use the final results after testing is complete to calculate the most optimal way to invoke redundancy sparing. In small arrays, such as a small DRAM macro that is included on an ASIC logic chip, the test engine includes fail address register 160 (FIG. 17) which accumulates failing addresses during testing for later uploading to the tester for redundancy calculation, eliminating communication with the tester during the test itself.

Preferably each chip P/F line from each test engine is brought out independently to simplify data collection. Preferably a whole wiring level on membrane 20 is used for these wires. FIG. 14 shows a top view of membrane wiring with P/F lines extending from the output of the XOR compare circuit associated with each test engine (FIG. 13) and extending to pads 8 located along periphery 39 of membrane 20.

Figure 15:
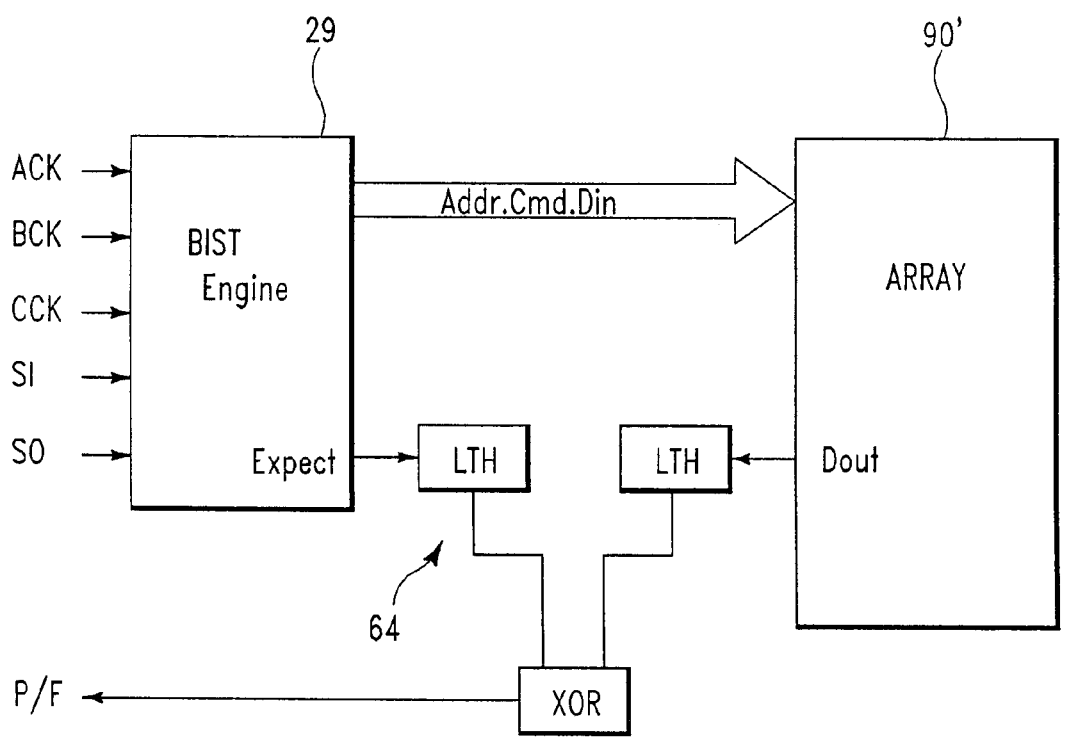
FIG. 15 is a block diagram of connections to a test engine, to a chip, and to external contact for testing the chip.

$S_i$ is used to initialize the logic in the test engine (via A clock and C clock) and to test logic circuits on the chip through level sensitive scan design (LSSD) protocol as shown in the functional block diagram of FIG. 15. LSSD allows a single input pin to be used to provide a data stream to input test vectors to test all the test engine logic. The data is serially scanned in through $S_i$ to shift register latches. The functional clocks B clock and C clock are exercised to push the test vectors through the chip logic. The test vectors are captured by shift register latches tied to the $S_o$ pad which is used to scan out vector data (via A clock and C clock).

$S_o$ is used to output test vectors verifying the test engine logic function on the chip. This logic test is accomplished during manufacturing test. $S_o$ is also used to scan out failed array addresses for memory chips that are tested with the test engine.

Test vectors, in addition to those generated by on-wafer test engines, can also be provided from an external tester. For high-speed test, these test vectors can be downloaded to memory associated with the on-wafer test engine at relatively low speed and then applied to the chip at high speed from there.

As shown in FIG. 15, test engine 29 has n lines for a $2^n$ array for addressing. For example, 22 address lines Addr are needed for a 64 megabit chip having 16 I/O. Ten additional lines are needed for control commands Cmd, including RAS, CAS, write enable, clocks, and strobes. Also, one data in (Din) line is needed for each I/O in array 90' to bring the data in to and out of that I/O. Thus, for a 64 megabit chip having 16 I/O, 48 lines are needed to connect test engine 29 with array 90'. For shared test engines these 48 lines go to 48 pads on each DRAM chip. For a test engine for testing a single chip, it is more practical to distribute the 48 connections internally within the chip being tested. These I/O lines connect test engine 29 to all portions of array 90' for full functional testing of the array. Data coming out of array 90' at $D_{out}$ is compared with Expect data in comparator 64.

The memory arrays are preferably stressed, stimulated, and tested at 140° C. With test engines located on wafer, memory arrays can be reliably contacted for testing at 140° C. and the test engines can detect those memory arrays that fail at 140° C. In addition, stimulation and testing can be at significantly higher speed with on-wafer test engines than is available with traditional burn-in since loading to each test engine is significantly reduced. Furthermore, a retesting step after burn-in can be eliminated since the full test program can be provided through the on-chip or on-wafer test engines.

Burning-in DRAM poses a particular challenge since voltage stress within a DRAM memory cell declines as charge stored in the cell capacitor leaks away. Each generation of DRAM chips has a larger number of word lines that must be written in each burn-in stress pattern. The time delay between write cycles has therefore increased, allowing more time for the cell to leak, reducing the stress across the oxide. This has lengthened the time the chips needed to be burned-in. This problem could not be fixed by increasing write frequency with conventional burn-in equipment. Standard DRAM burn-in provides signals from a burn-in tester through burn-in boards to an array of DRAM modules, and that loading substantially slows the rate signals can be provided to each chip.

The present inventors recognized that burn-in stress level depends on the frequency the cells can be restored to the state having the highest voltage across the capacitor oxide. They found that by providing test engines on each DRAM chip (or on-wafer proximate to the DRAM chips) a higher frequency of write pulses can be provided, higher than is available with standard burn-in technology with signals provided from a tester connected through the burn-in oven and burn-in boards. Because a defective cell or a weak cell may switch states, the inventors recognized that refresh alone is not sufficient; refresh would maintain the cell in the switched state and therefore would not provide the stress needed to cause a weakened cell to fail. Thus, for burn-in to be successful, a test engine is needed that will repeatedly write the desired patterns into the DRAM array. The present inventors recognized that on-chip, on-wafer or on-module test engines running at high speed maintain the DRAM cell capacitors at a substantially higher voltage than is available with conventional low speed burn-in. They recognized that this provides substantially greater burn-in efficiency. The inventors further recognized that the higher voltage and greater efficiency permits burn-in time to be reduced as compared with conventional DRAM burn-in with low frequency oven testers. This time savings and the reduced requirement for oven tester equipment substantially lowers the cost of burn-in. This advantage is available whether the DRAM chips are burned-in at wafer level or after packaging in a module.

Figure 16:
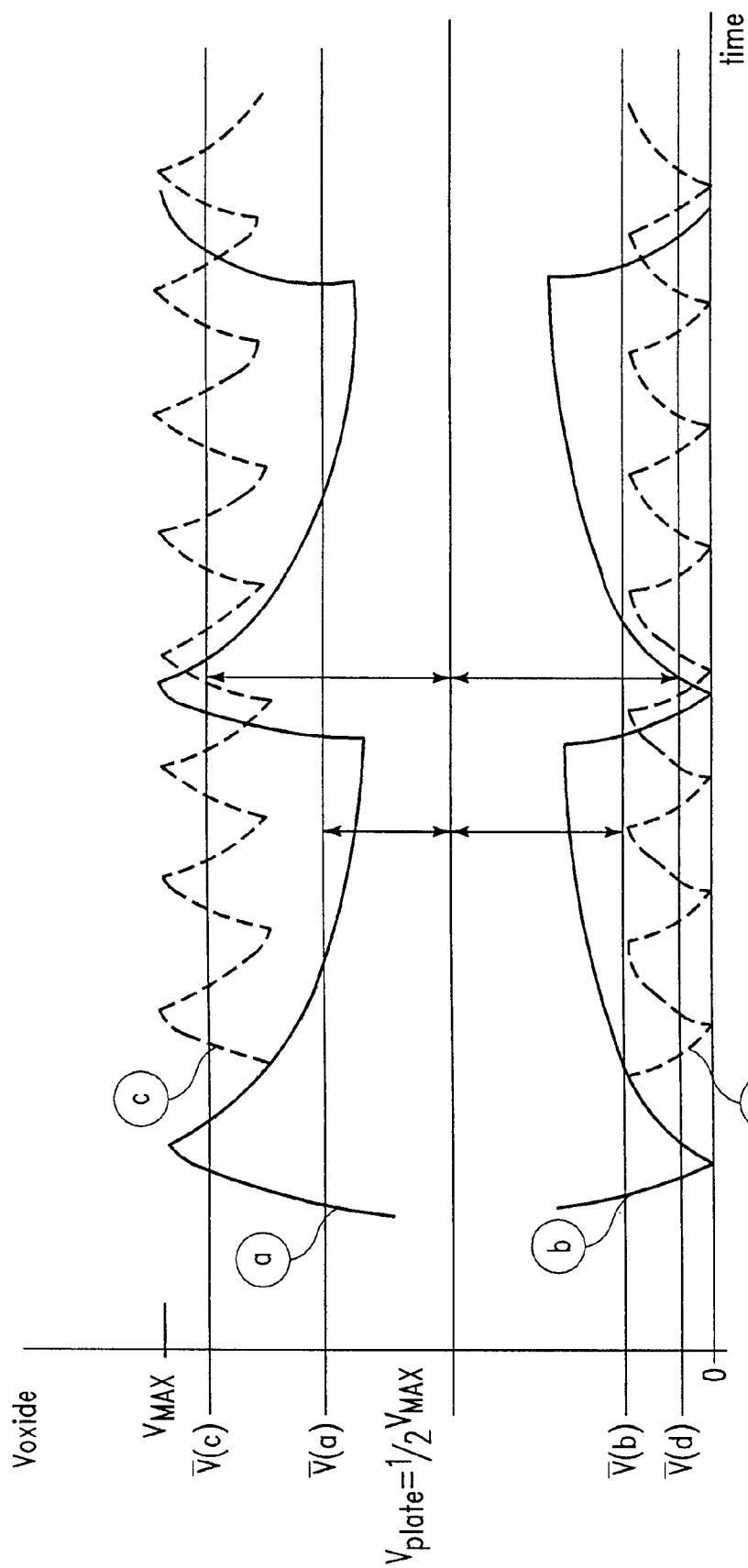
FIG. 16 is a timing diagram showing how voltage across a DRAM capacitor is retained at a higher level when a DRAM array is written with a high speed test engine.

FIG. 16 illustrates the advantage provided by on-wafer test engines on a cell capacitor having a plate with a fixed plate voltage $V_{plate}$ set at half the maximum storage voltage $V_{max}$. Curve (a) illustrates the extent of decay of a high voltage level across the cell capacitor before a rewrite signal can be provided to a word line using conventional low frequency signals provided from a burn-in tester outside the burn-in chamber. (b) illustrates the decay of a low voltage level across the cell capacitor using conventional burn-in. The average stress levels are shown by V(a) and V(b). Curves (c) and (d) are the corresponding curves with the higher write frequency, showing that the cell is maintained at a substantially higher voltage. With faster write rate available with on-wafer test engines, curves (c) and (d) show that the stress on capacitor oxides remains substantially greater than is available with conventional burn-in. Because the frequency is higher the average voltage across the storage capacitor oxide is higher, as shown in V(c) and V(d), and the amount of time spent at the maximum voltage is greater. The present inventors recognized that the increase in the fraction of time in burn-in that the cell experiences a higher average voltage permits overall burn-in time to be correspondingly reduced.

In one embodiment burn-in is accomplished using a very simple state machine test engine 29 to generate patterns and detect fails. The state machine for testing may perform simple stuck fault testing or also present functional patterns to each chip for unique sensitivities. State machine test engines are well known in the art, having long been in use for logic chip testing. They are described in commonly assigned U.S. Pat. No. 5,173,906, incorporated herein by reference.

Figure 17:
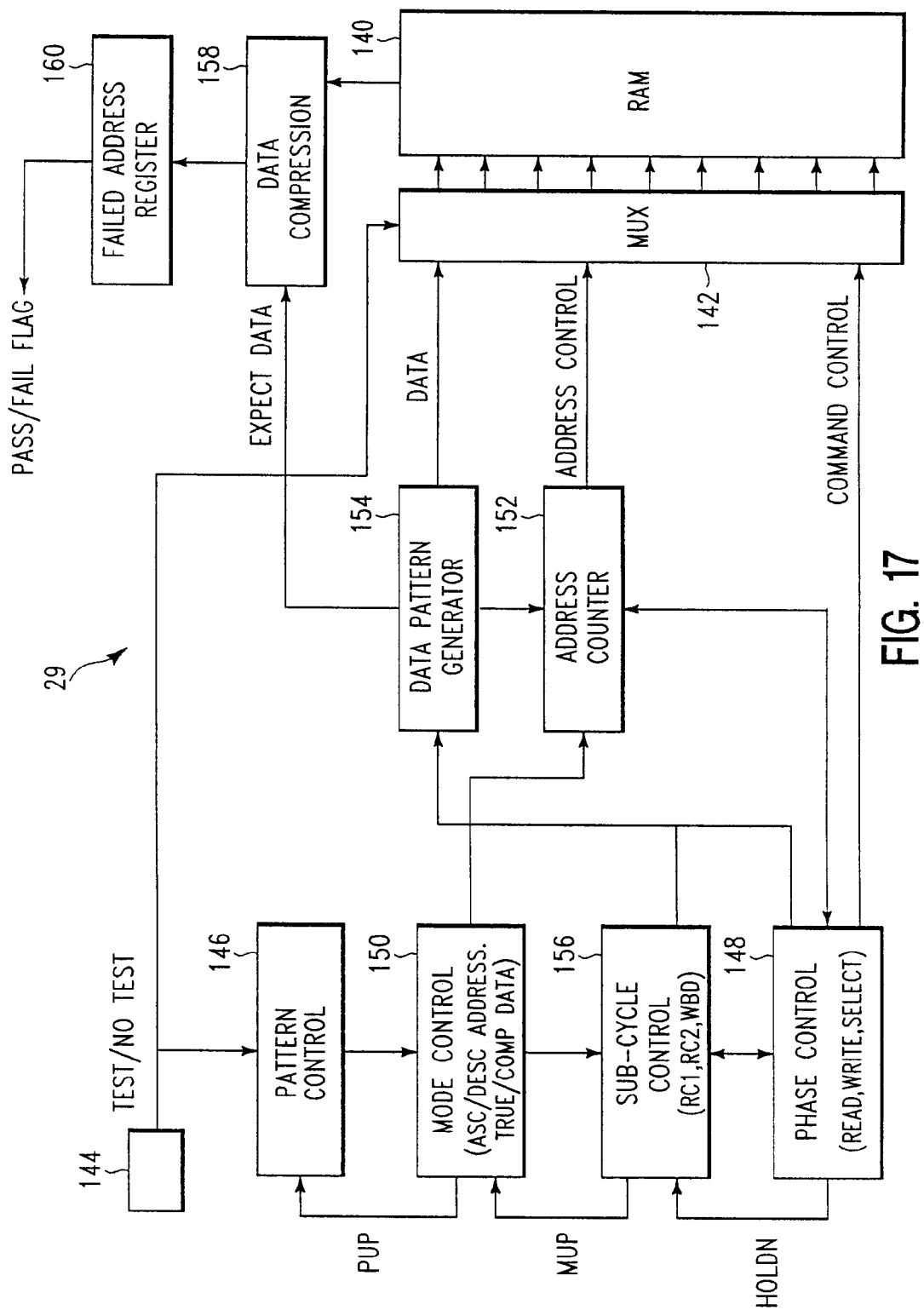
FIG. 17 is a block diagram of connections between a test engine and a memory array chip.

In brief, state machine based test engine 29 and its connection to random access memory (RAM) 140 is illustrated in FIG. 17. RAM 140 receives three signal sets via MUX 142 from test engine 29 (Data in, Address, and Command). MUX control is provided by external signal input 144 called "Test/No test." Typical pattern sets for burn-in test may include Unique Address Ripple Word and Ripple Bit, Checkerboard, Word line Stripe, Data Stripe and Blanket patterns. All patterns are programmed into the state machine during chip design and can only be changed by hardware redesign.

State machine operation mimics a nested FORTRAN "do-loop"; the outer loop being Pattern Control unit 146 and the innermost loop being the Phase Control unit 148. Each "do-loop" leg or block is responsible for maintaining particular information about the pattern being executed. Pattern Control 146 points to the specific pattern being exercised, and pushes the test engine into a continuous pattern set loop for burn-in. Mode Control 150 sets address counter increment/decrement flag 152 and sets Data Pattern Generator true/compliment data flag 154. Subcycle Control 156 maintains the per address read/write sequence for the current test pattern.

All test patterns can be broken down into three basic sequences, which are blanket write (WBD), blanket read (RC1) and read/write/read (RC2). Phase Control 148 generates and controls the input signal wave forms to the RAM macro on a per cycle basis. It is also responsible to controlling fail result computations during read cycles. During a typical operational scenario, Phase Control block 148 issues per address read/write commands to RAM 140. Once the per address read/write sequence is satisfied, address counter 152 is updated to the next address. This continues for the full RAM address space. Once the maximum address is reached, the HOLDN signal is issued to Subcycle Control 156 for a new per address read/write sequence, and address counter 152 is reset. As in a "do-loop" fashion, when Subcycle Control 156 has completed all pattern sequences for a particular Mode Control 150 order, a MUP signal is issued to Mode Control 150 for a new addressing and data permutation. This procedure is continued until all patterns have been executed and fails logged.

"Ripple" Address Counter 152 and the Data Pattern Generator 154 present input information to DRAM 140, but under strict control of State Machine 29. Data Compression 158 receives output data from DRAM 140 and compares it to expect data computed and provided by Data Pattern Generator 154. Data compression 158 reduces the full DRAM data output width to one pass/fail bit via an exclusive-or tree. If a failure occurs, the address of the fail is stored in Failed Address Register 160.

Figure 18:
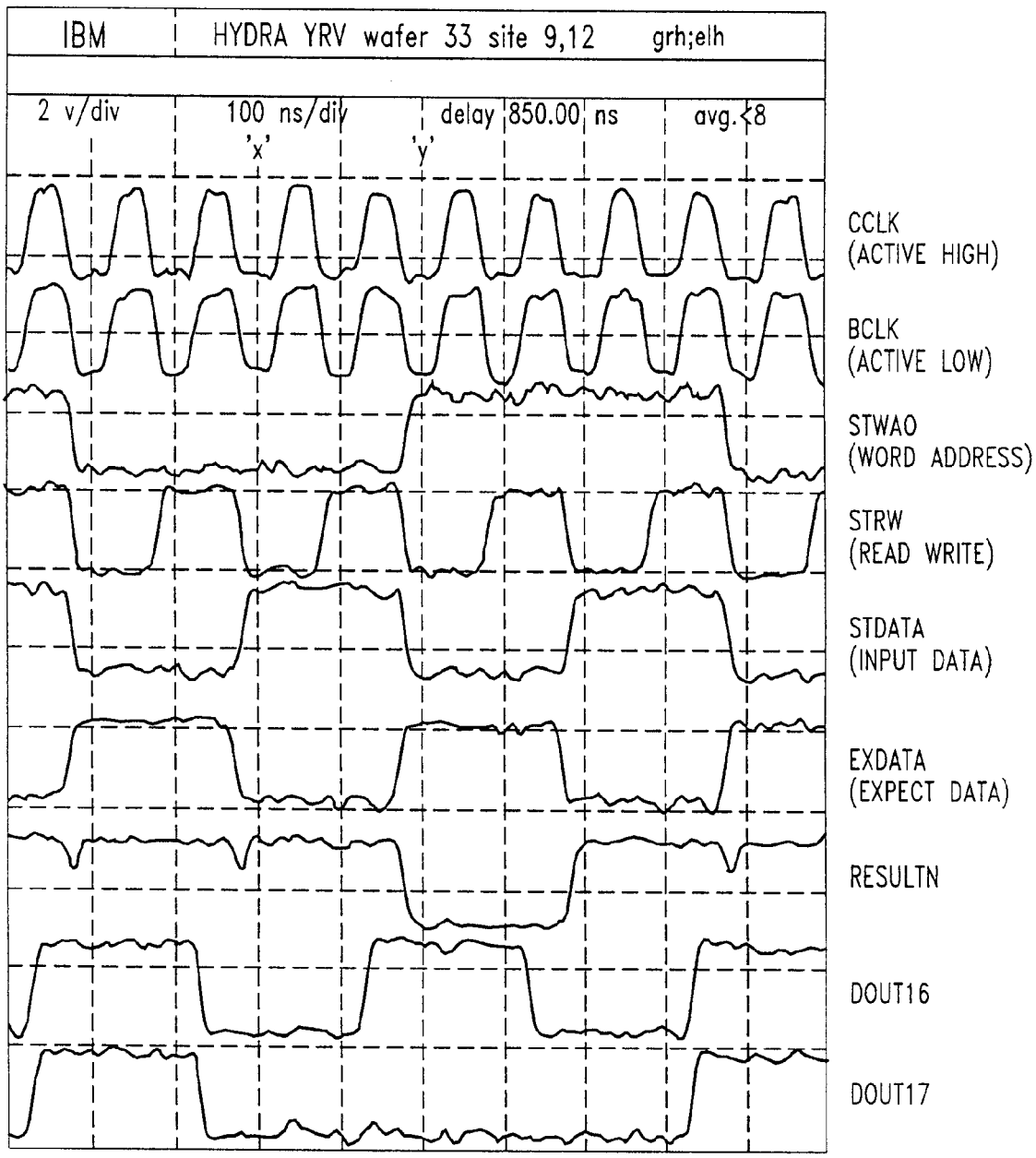
FIG. 18 is a timing diagram showing a test engine internal timings.

Test engine operation is controlled by dual non-overlapping clocks (CCLK and BCLK) in an L1/L2 SRL logic environment where DRAM 140 is treated as an L1 entity. During any functional clock cycle, test engine 29 is executing three major tasks; computing addresses and DRAM input data for the next operation cycle, performing read/write operations on the DRAM, and logging fail results from a previous read operation. Test engine 29 internal timings from hardware are shown in FIG. 18. DRAM 140, which is designed to latch last read data until a new read is executed, is synchronized by an external clock in phase with BCLK. This permits operational skewing between test engine 29 and DRAM 140. With STWAO (word address) low the first read/write operation is performed successfully, i.e. EXDATA coincides with array macro output DOUT16 and DOUT17 at mark "x", which is signified by a high from the Data Compression circuit output RESULTN. However, DOUT17 fails the next READ '1' operation which is signified by RESULTN going low at mark "y". The failed address is then stored into the Failed Address Register. Results of all failed addresses would be scanned out during a burn-in chamber read out. Having the fail data, redundancy can be implemented to replace failing cells, word lines or bit lines.

For pattern sensitive testing of memory and to provide on-chip or on-wafer calculations needed to determine optimum redundancy allocation, a processor based test engine may be used. A processor based test engine for testing DRAM arrays embedded in logic chips has been described in commonly assigned U.S. patent application Ser. No. 08/803,053, incorporated herein by reference. The present invention provides for using these processor based test engines at wafer test and during wafer-level burn-in to provide pass and failing data and to allocate redundancy to repair failing chips.

Figure 19:
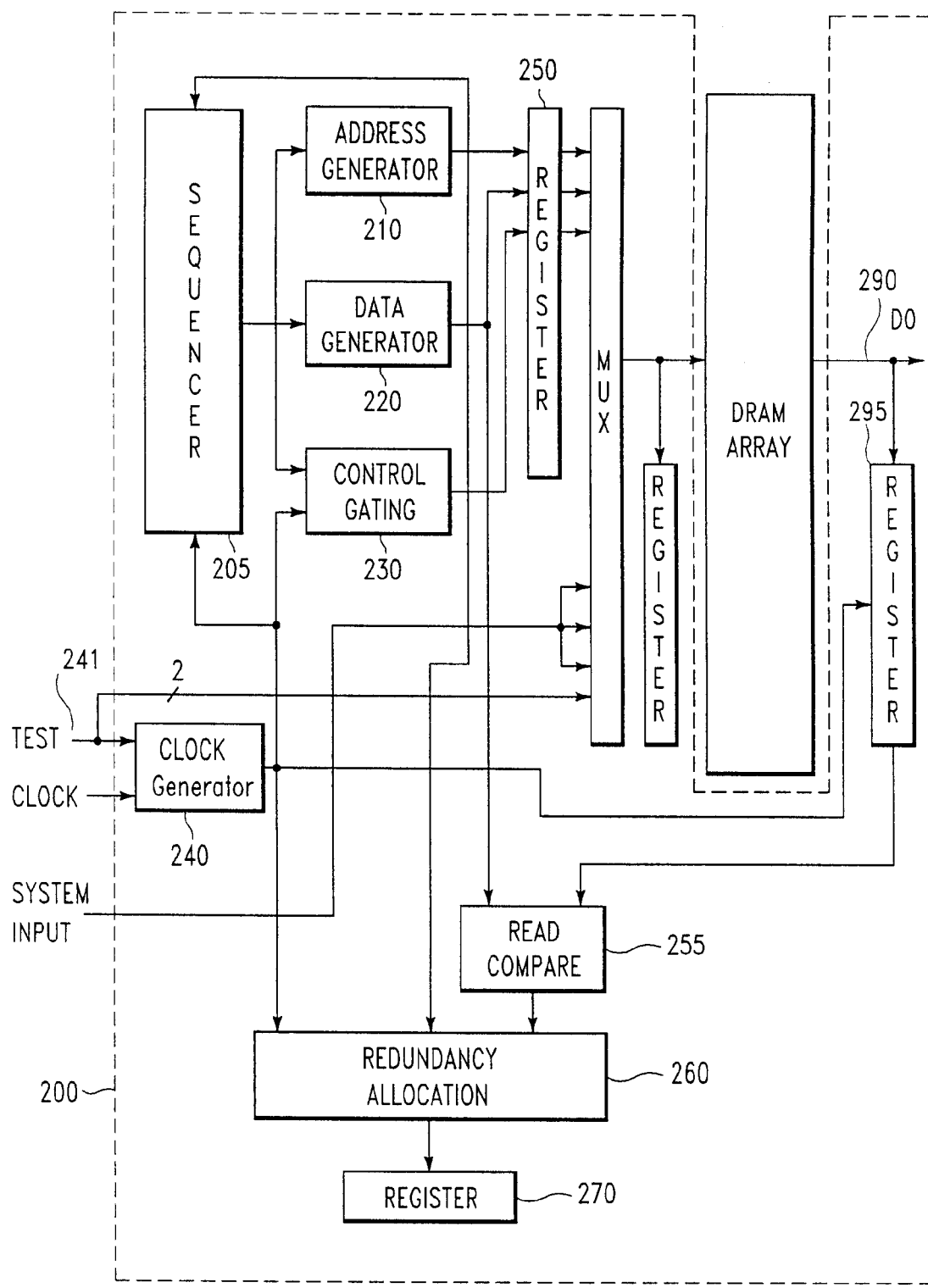
FIG. 19 is a block diagram of showing a processor based test engine connected for testing a memory array.
Figure 20:
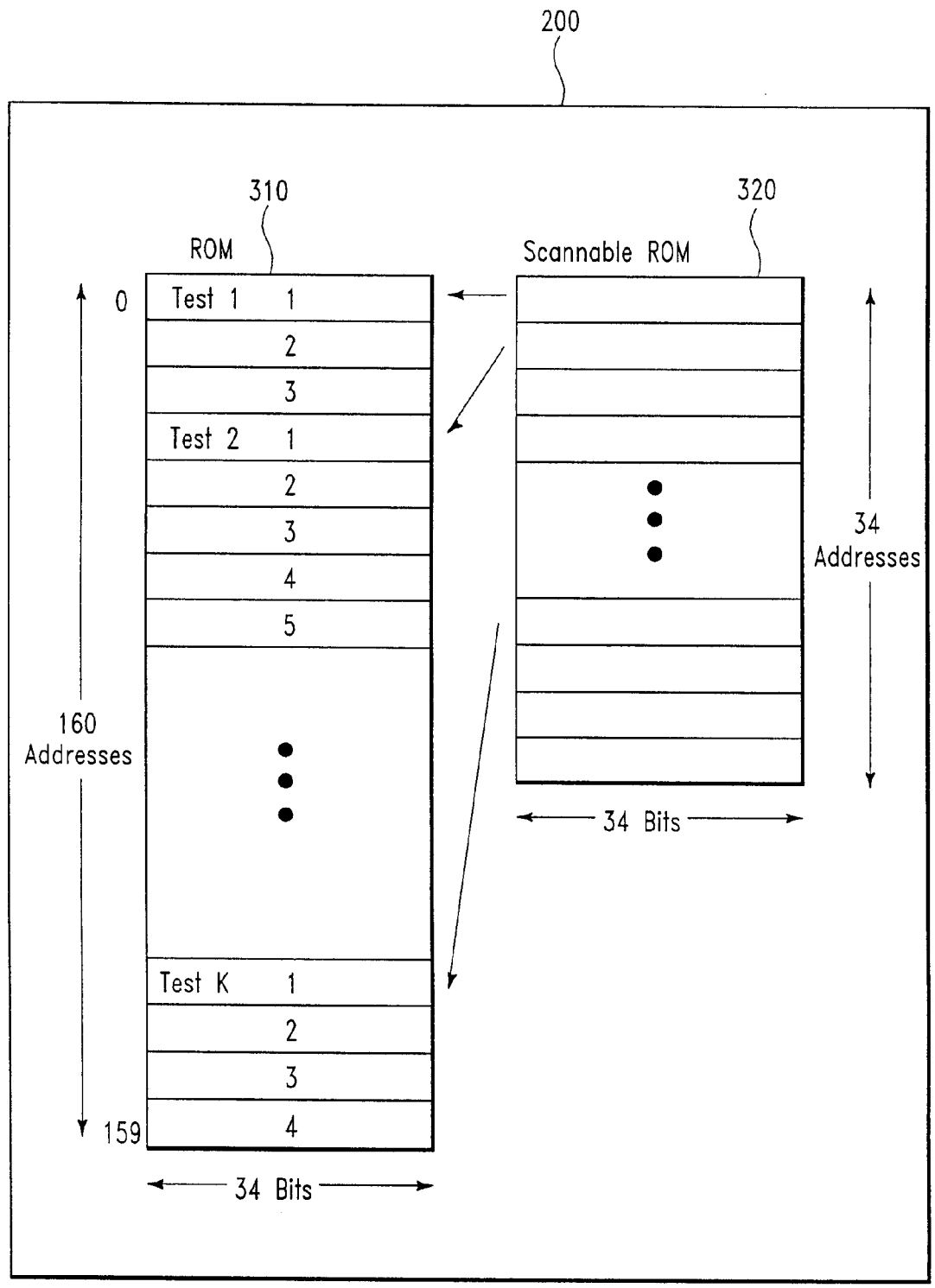
FIG. 20 is a block diagram showing the fixed and scannable ROM used in the sequencer of FIG. 19.

In brief, processor based engine 200 includes seven components, as shown in FIG. 19: sequencer 205 containing the memory shown in FIG. 20, address generator 210, data generator 220, control block 230, clock generator 240, boundary latch pipe state (shown as register 250), and two-dimensional redundancy block 260.

The memory shown in FIG. 20 includes late programmable fixed ROM 310 and scannable ROM 320. Late programmable fixed ROM 310 can be altered at a late mask step in the process line for fabricating the wafer 26. Scannable ROM 320 is latch based memory that can be programmed at any time. Combined sequences of instructions stored in these memories constructed by sequencer logic 205 produce typical test patterns for testing a DRAM array. Thus, full test programs to characterize all aspects of DRAM array are generated.

Scannable ROM 320 permits adding patterns to test program microcode after the DRAM array has been fabricated so that newly discovered defect modes can be characterized. These new patterns can later be included in fixed ROM 310 when new masks are generated. In addition to providing for altering patterns or adding new patterns, scannable ROM 320 can be used in test engine 200 to repeatedly loop on a pattern or patterns to aid in characterization of defects. The looping is provided by putting an appropriate branch address in scannable ROM 320.

As described in the Ser. No. 08/803,053 patent application, test engine 200 is provided with a two-dimensional redundancy allocation arrangement represented by blocks 255, 260, and 270 of FIG. 19. The redundancy allocation arrangement monitors all the data comparison failures and determines an efficient use of redundant word lines and data bit elements without requiring a composite bit failure map. Read compare block 255 compares expected values provided by data generator 220 with observed values at DO output 290 of the DRAM array. These values are stored in output register 295 during test. Appropriate timing for capturing the observed test data is provided by clock generator 240. Register block 270 stores the results of the redundancy allocation logic and allows scanning the results out to the die pads or to the module pins. A full description of redundancy logic block 260 is provided in the Ser. No. 08/803,053 patent application, and the reader is referred there for details as to how redundancy is calculated.

In essence redundancy logic block 260 utilizes two test passes of a pattern through the memory to allocate how to implement redundancy. The first pass identifies the must fix failures which are failures that can only be fixed by elements in one of the two redundant dimensions. For example, if there are 6 fails along a bit line and there are only 4 redundant word lines, the fail must be fixed by replacing the failing bit line. Once these are identified and stored within the logic their corresponding fails can be masked during a second pass of the pattern, where the remaining fails are fixed by other redundant elements best suited for the fails identified.

Because processor based test engines can be programmed to provide any desired pattern to the array, processor based test engines can be used for final test as well as for in situ burn-in. Thus, all fails can be identified at wafer level before redundancy is invoked and all repairs made at wafer level, capturing yield loss that would otherwise be sacrificed as burn-in fallout.

Test engines 29, 200 are connected to chip I/O pads 32". In the case where a single test engine drives multiple chips 28a, 28b, 28c, 28d, 28e (FIG. 12c), lines 160a, 160b, to corresponding I/O pads 32a", 32b", of each chip are tied together in common. An additional chip enable line 164a, 164b, is provided for each chip connected to test engine 200 and used to enable chips 28a, 28b, 28c, 28d, 28e sequentially for serial testing (however, tests such as retention time tests could overlap). Test engine 200 works in conjunction with LSSD and uses scan to intitialize test engine 200 and to unload test results. Twenty to thirty separate lines 160a, 160b, plus lines 164a, 164b, are needed for connection between test engine 200 and chips 28a, 28b, 28c, 28d, 28e to which it is connected.

In another embodiment shared test engine 165 has its compare and redundancy allocating components distributed to each chip 28, as shown in FIG. 21. Shared test engine 165 continues to contain the sequencer 205 and the memory 310, 320 (FIGS. 19, 20) that contains microcode to provide test data and control signals used to test chip 28. With this arrangement the signals for test and expected value signals are sent out to all chips 28 connected to shared test engine 165 simultaneously. The compare step and the redundancy allocation step, both performed during testing, are run simultaneously on all chips 28. Thus, time for testing and calculating redundancy for all the chips on a wafer is reduced to the time required to test a single chip.

As shown in FIG. 21 control signals are distributed from test engine 165 on control lines 166 and data signals are distributed on data lines 167 to aft chips 28 simultaneously. The same data is later sent again as expect data for a read cycle on the same data lines 167 to the compare circuit on each chip for local and simultaneous comparison with data read from each memory array. Typically data is written sequentially to many addresses to provide a pattern that is likely to disturb data in various cells. Then data is read from the array to see if the data that was written is still there. Test engine 165 marches through the addresses writing data to cause fails and then sends the data again for compare and fail detection.

Information regarding failing array elements is stored locally in registers in redundancy allocation register 260' (,FiG. 19)on each chip 28, and that information is used to allocate redundancy on all chips 28 simultaneously.

Generally, storage registers are provided in redundancy allocation register 260' to store an amount of data corresponding to the number of redundant elements available. Registers for an entire word line fail or bit line fail compress the amount of storage needed. To optimize the redundancy allocation a two-pass system is used, as described in the Ser. No. 08/803,053 patent application. In a preferred embodiment compare and redundancy are provided for each one-megabit repair region on the chip.

The redundancy allocation information is read off the wafer by means of scan chain 170 connected to each chip 28 on wafer 26. From the two pins 171, 172 of scan chain 170 the redundancy allocation is read for transmission to a laser system to cut fuses on chips 28 for implementing redundancy (the information can also be used to set electronic fuses or antifuses for implementing redundancy). This embodiment eliminates the need to send the data read from the memory array back to test engine 165 for comparison there (FIGS. 11a, 11b). Thus, only a one-directional data line 167 is needed. This embodiment also has each data line 167 and each control line 166 in common between shared test engine 165 and all chips 28 being tested by that test engine. Thus, fewer test engines or only one test engine is needed for testing all chips 28 on entire wafer 26. The small number of test engines need not be located in kerf 51 (where they would be replicated for every chip). Instead they can be located, for example, on one chip site on wafer 26, along a center line of wafer 26, or along the perimeter of wafer 26. Memory arrays that can be tested using this approach include DRAM, SRAM, NVRAM, and ROM.

Alternatively, test engine 29, 200 can be located within each chip or it can be located in kerf 51 between chips as shown in FIGS. 12a–12c. If located on each chip, test engine 29, 200 continues to be available for testing after the chip has been packaged and provided in a system. If located in kerf 51 or located in a single chip site or along the periphery of the wafer, test engine 29, 200, 165 is only available tor testing while connected to the chip I/O's before the wafer is diced.

As an alternative disconnect scheme, gating transistors 176 are provided for each chip 28a–28e to disconnect power to a chip that is shorted or that shorts during test or burn-in, as shown in FIG. 12c. (For clarity transistors 176 and wiring to these transistors are only shown for two of the chips). Power is provided to each transistor 176 along common wire 178. Gate control line 179 from each transistor 176 extends on membrane 20 to test engine 29, 200 for control over connection to each chip individually. Alternatively gate control line 179 from each transistor 176 is connected to pads for external control. Power can be provided to all chips through their transistors 176 for sequential test. If a shorting problem is detected, power is provided to one of the chips connected to shared test engine 29, 200 at a time. Because DRAM chips draw low current (less than 500 mA), IR drop across gating transistor 176 is low and negligibly effects test voltage. Variation in current is much lower on DRAM chips than on logic chips and hence the voltage variation form chip to chip will be small. Because currents for a DRAM are small gating transistor 176 can be small and it can, for example, be located in kerf 51. Alternatively, since the current draw of a DRAM is relatively low it may also be possible simply to resistor isolate the power supplies to isolate shorted chips; in this case gating transistor 176 is replaced with a resistor.

Gating transistor 176 or an isolating resistor is provided in the power supply line to each chip only during wafer test and burn-in. During normal operation other pads to the chip are used for power connection. Thus, gating transistor 176 is used only during test and burn-in.

Gating transistor 176 is located in the kerf adjacent each chip and is connected to its corresponding chip through membrane 20. Thus, power lines extending across membrane 20 connect first through gating transistor 176 in kerf 51, then back to membrane 20 for distribution to chip 28. Alternatively gating transistor 176 can be located within chip 28, and in this case on-chip wiring can be used to connect it to power lines on chip 28.

In addition to power connection, all other lines 160a, 160b extending from shared test engine 29, 200 to pads 32a", 32b" on chip 28 can be provided through gating transistors 184 that are similar to gating transistors 176. All of the gating transistors 176, 184 for a particular chip are located in kerf 51 and all can be controlled by a single line 186 that extends from the common gates of gating transistors 176, 184 to test engine 29', 200, 165 or to a pad on membrane 20 that controls the connect/disconnect state of that chip. Thus, all connection to a chip can be disconnected by a single gate control signal on a single line 186 that extends to that chip. Alternatively the gating transistors 176, 184 can be located within chip 28, and in this case on-chip wiring can be used to connect each gating transistor to the corresponding lines on chip 28. Gating transistor 176, 184 is only used during testing. For functional operation of chip 28 gating transistor 176, 184 is not in the circuit to avoid series resistance or capacitive load. Separate functional chip pads 32a", 32b" and other functional chip pads are directly connected externally, bypassing gating transistor 176, 184. In addition to these gating transistors 176, 184 and the cuttable membrane connectors 31 previously described, fuses, and other devices, such as electrically-controlled fuses and memory devices, can be used to disconnect defective or shorted chips.

Test engine 29, 29', 200, 165 is made out of the same technology as other chip components but it can be designed with additional guard band and relaxed ground rules (if necessary) to insure that it operates with high reliability at burn-in temperature to provide assurance that all chips will receive stimulus during burn-in. Typically circuits in a design library are designed to operate at burn-in temperature. Test engines are preferably designed with more relaxed ground rules to further ensure their operation in burn-in.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method of testing a semiconductor wafer comprising the steps of:
    a) providing a semiconductor wafer comprising integrated circuit chips, wherein said chips comprise a memory array, said wafer further comprising a circuit comprising a first element, a second element, and a third element, said wafer further comprising contacts for electrically connecting said circuit for external connection;
    b) running said first element, said first element presenting array test patterns to said memory array;
    c) running said second element, said second element receiving a result of said test patterns from said array;
    d) running said third element, said third element using said received result to allocate redundancy to repair a defect on said memory array; and
    e) providing said information for implementing redundancy on said memory array to repair said defect.

2. A method as recited in claim 1, wherein in said providing step (e) said information is sent off-wafer for repairing said array.

3. A method as recited in claim 1, further comprising a membrane connected to said contacts, said membrane comprising wiring.

4. A method as recited in claim 1, wherein said device is a memory element.

5. A method as recited in claim 4, wherein said memory element comprises registers.

6. A method as recited in claim 4, wherein said device is a laser cutting a fuse.

7. A method as recited in claim 4, wherein said memory element is an electrically programmable memory element.

8. A method as recited in claim 4, wherein said memory element is a non-volatile memory device.

9. A method as recited in claim 1, further comprising the step of dicing said wafer, wherein said providing information step (e) is performed before said dicing step.

10. A method as recited in claim 9, further comprising the step of repairing said defect and burning-in chips on said wafer, wherein said repairing step is performed after said burning-in step and before said dicing step.

11. A method as recited in claim 1, further comprising the step of burning-in a chip on said wafer using signals from said circuit, wherein time for running said step of burning-in said chip is adjusted to take into account rewrite speed available by providing said circuit on-wafer.

12. A method of testing a semiconductor wafer comprising the steps of:
    a) providing a wafer comprising a plurality of integrated circuit chips, said wafer further comprising a test engine, said test engine connected to said plurality of chips;
    b) testing said plurality of chips on said wafer with said test engine;
    c) burning-in said chips on said wafer using signals from said test engine, wherein time for running said step of burning-in said chips is adjusted to take into account rewrite speed available by providing said test engine on-wafer.

13. A method as recited in claim 12, wherein in said testing step (b) said chips are tested sequentially.

14. A method as recited in claim 12, wherein in said testing step (b) said chips are tested at the same time.

15. A method as recited in claim 12, wherein said test engine provides fill final test patterns for said testing step (b).

16. A method as recited in claim 12, wherein in said chips are burned-in at the same time.

17. A method as recited in claim 12, further comprising the step of implementing redundancy information on said chips and dicing said wafer, wherein said implementing redundancy step is performed after said burn-in step and before said dicing step:
    a) providing a wafer comprising a plurality of integrated circuit chips, said wafer further comprising a test engine, said test engine connected to said plurality of chips:
    b) testing said plurality of chips on said wafer with said test engine;

c) burning-in said chips on said wafer, d) storing redundancy information after said burning-in step to optimize redundancy allocation.

18. A method of burning-in an integrated circuit chip comprising the steps of:
   a) providing a test engine proximate the chip to provide high frequency signals to said chip;
   b) burning-in the chip using signals from said test engine, wherein time for running said step of burning-in said chip is adjusted to take into account said high frequency signals available by providing said test engine proximate to the chip.

19. A method as recited in claim 18, wherein in said chip is located in a module.

20. A method as recited in claim 19, wherein in said test engine is located on said chip.

21. A method as recited in claim 20, wherein said chip comprises a DRAM array and wherein said test engine provides a write signal to said DRAM array.

22. A method as recited in claim 21, wherein burn-in time is adjusted to take into account the proportion of time a voltage close to the applied voltage is provided across cells of said array as a result of providing said chip with a high frequency write signal from said proximate test engine.

23. A method as recited in claim 18, wherein said chip is located on a wafer.

24. A method as recited in claim 23, further comprising a plurality of chips on said wafer.

25. A method as recited in claim 24, wherein in said test engine is shared by said plurality of chips.

26. A method as recited in claim 24, wherein in said test engine is located on said wafer.

27. A method as recited in claim 24, wherein in said test engine is located on said chip.

28. A method as recited in claim 18, wherein said chip has a circuit that has a voltage that decays with time, wherein said test engine provides a signal to restore a higher voltage to said circuit.

29. A method as recited in claim 28, wherein burn-in time is adjusted to take into account the proportion of time a voltage close to the applied voltage is provided across said circuit as a result of providing said chip with a high frequency write signal from said proximate test engine.

30. A method as recited in claim 29, wherein in said circuit is a DRAM array and said test engine rewrites data to said DRAM array.

* * * * *